(12) United States Patent
Niimi et al.

(10) Patent No.: US 9,640,535 B2
(45) Date of Patent: *May 2, 2017

(54) METHOD FOR FORMING SOURCE/DRAIN CONTACTS DURING CMOS INTEGRATION USING CONFINED EPITAXIAL GROWTH TECHNIQUES AND THE RESULTING SEMICONDUCTOR DEVICES

(71) Applicant: GLOBALFOUNDRIES Inc., Grand Cayman (KY)

(72) Inventors: Hiroaki Niimi, Cohoes, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/175,540

(22) Filed: Jun. 7, 2016

(65) Prior Publication Data

US 2016/0351566 A1   Dec. 1, 2016

Related U.S. Application Data

(63) Continuation of application No. 14/722,818, filed on May 27, 2015, now Pat. No. 9,397,003.

(51) Int. Cl.
*H01L 21/768* (2006.01)
*H01L 27/092* (2006.01)
(Continued)

(52) U.S. Cl.
CPC ...... *H01L 27/092* (2013.01); *H01L 21/28525* (2013.01); *H01L 21/76801* (2013.01);
(Continued)

(58) Field of Classification Search
None
See application file for complete search history.

(56) References Cited

U.S. PATENT DOCUMENTS 9,397,003 B1 * 7/2016 Niimi .............. H01L 21/823418
2010/0081262 A1   4/2010 Lim et al.
(Continued)

OTHER PUBLICATIONS

Taiwanese First Office Action dated Jan. 10, 2017 for Taiwanese Patent Application No. 105104890, filed on Feb. 19, 2016.

*Primary Examiner* — Asok K Sarkar
(74) *Attorney, Agent, or Firm* — Amerson Law Firm, PLLC

(57) ABSTRACT

A semiconductor device includes an isolation region laterally defining an active region in a semiconductor substrate, a gate structure positioned above the active region, and a sidewall spacer positioned adjacent to sidewalls of the gate structure. An etch stop layer is positioned above and covers a portion of the active region, an interlayer dielectric material is positioned above the active region and covers the etch stop layer, and a confined raised source/drain region is positioned on and in contact with an upper surface of the active region. The confined raised source/drain region extends laterally between and contacts a lower sidewall surface portion of the sidewall spacer and at least a portion of a sidewall surface of the etch stop layer, and a conductive contact element extends through the interlayer dielectric material and directly contacts an upper surface of the confined raised source/drain region.

20 Claims, 20 Drawing Sheets

(51) Int. Cl.

| | |
|---|---|
| *H01L 21/8234* | (2006.01) |
| *H01L 29/66* | (2006.01) |
| *H01L 29/08* | (2006.01) |
| *H01L 21/285* | (2006.01) |
| *H01L 23/485* | (2006.01) |
| *H01L 21/8238* | (2006.01) |
| *H01L 23/532* | (2006.01) |

(52) U.S. Cl.
CPC ......... *H01L 21/76897* (2013.01); *H01L 21/823418* (2013.01); *H01L 21/823871* (2013.01); *H01L 23/485* (2013.01); *H01L 29/0847* (2013.01); *H01L 29/6656* (2013.01); *H01L 29/66545* (2013.01); *H01L 29/66628* (2013.01); *H01L 21/823842* (2013.01); *H01L 21/823864* (2013.01); *H01L 23/53266* (2013.01)

(56) References Cited

U.S. PATENT DOCUMENTS

| | | |
|---|---|---|
| 2012/0187459 A1 | 7/2012 | Pan et al. |
| 2013/0175625 A1 | 7/2013 | Cheng et al. |
| 2015/0035061 A1 | 2/2015 | Yoon et al. |
| 2015/0091060 A1 | 4/2015 | Yang et al. |
| 2015/0243661 A1 | 8/2015 | Matsumoto |
| 2015/0263133 A1 | 9/2015 | Yamamoto et al. |
| 2015/0349094 A1 | 12/2015 | Song et al. |
| 2016/0035861 A1 | 2/2016 | Park et al. |
| 2016/0071976 A1 | 3/2016 | Chang et al. |

\* cited by examiner

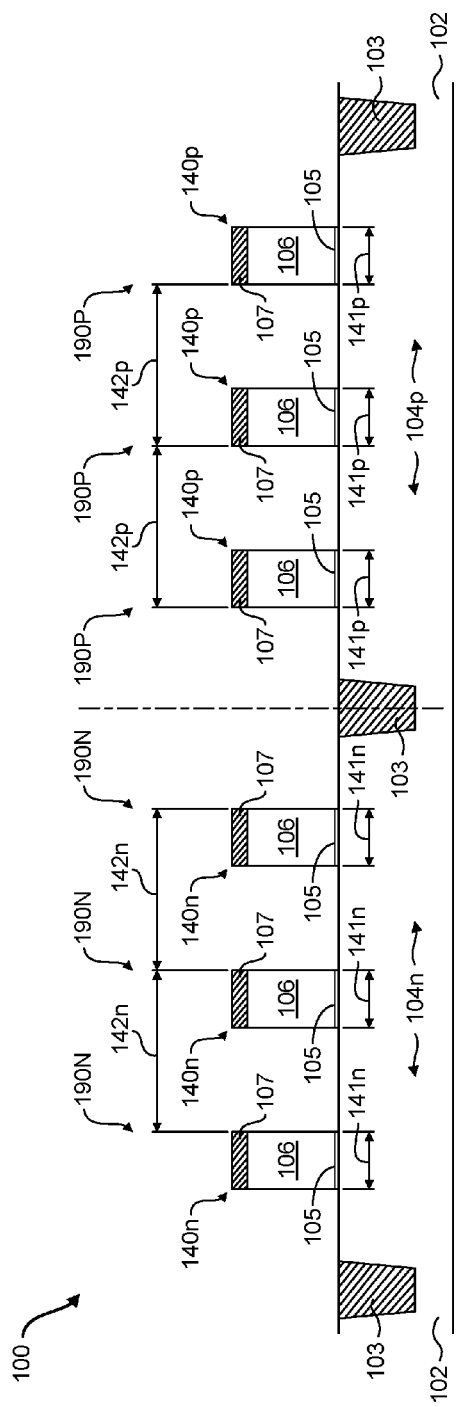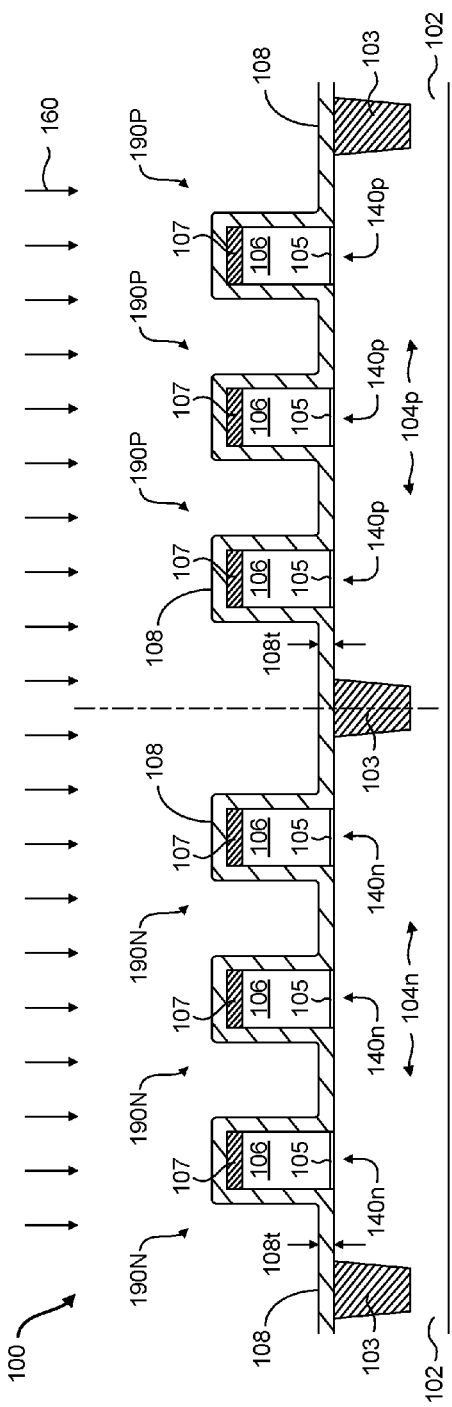

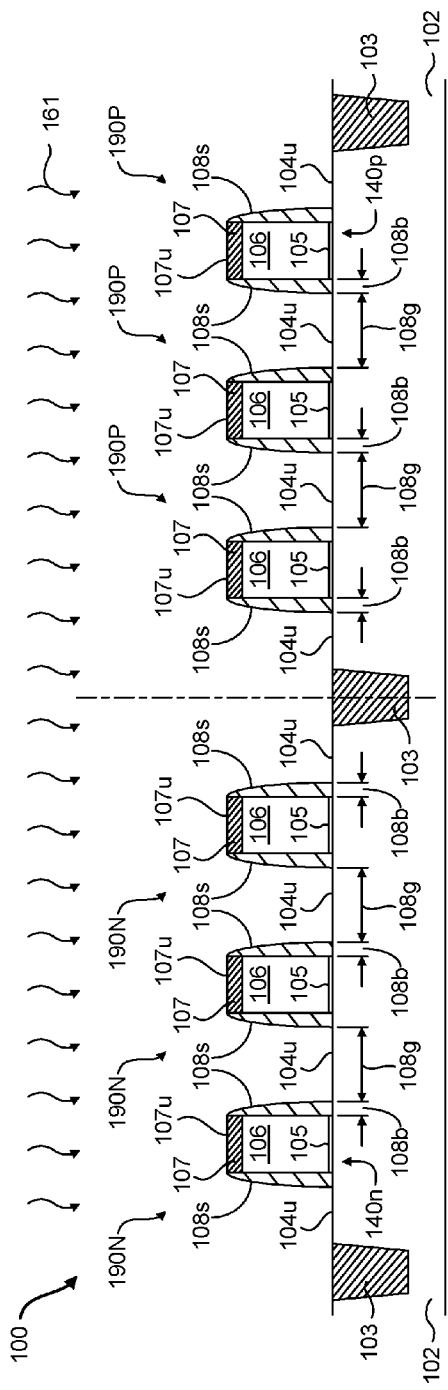
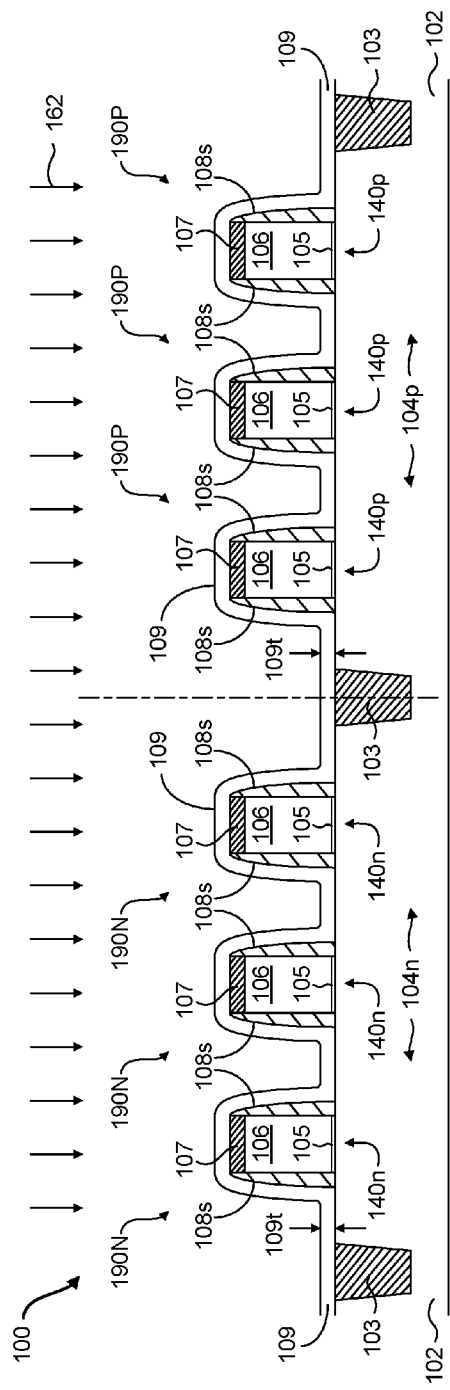
Fig. 1C
Fig. 1D

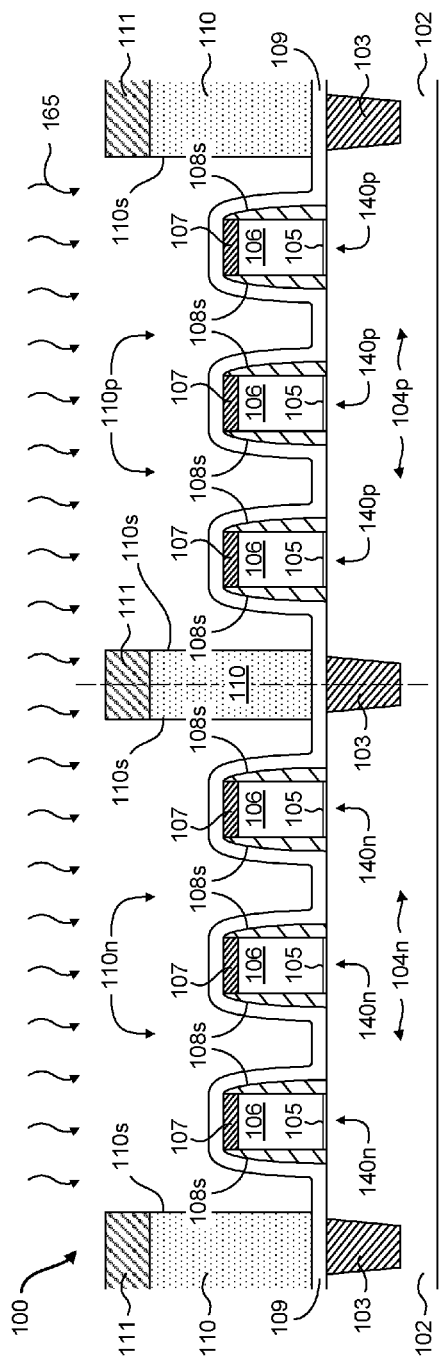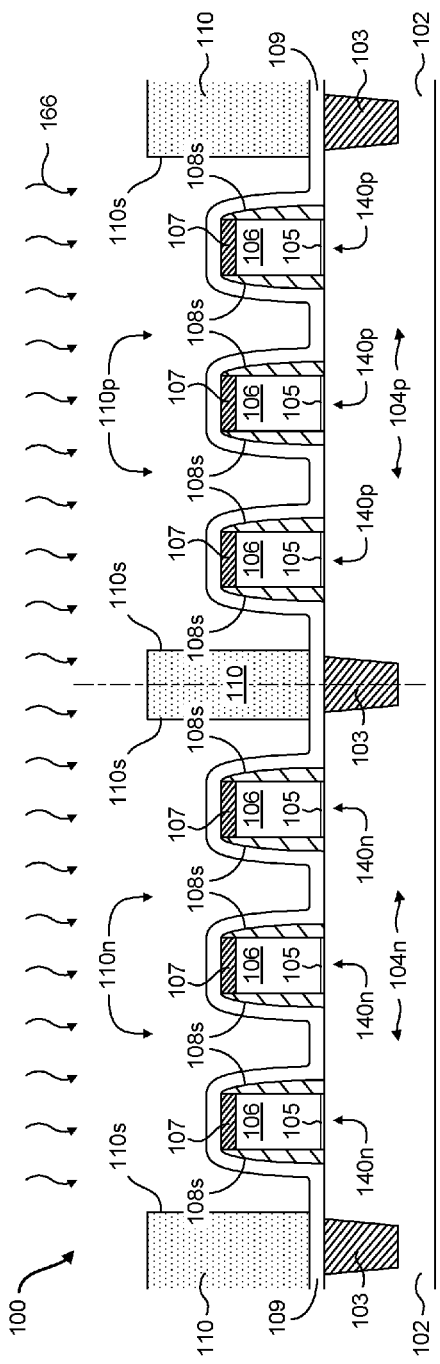

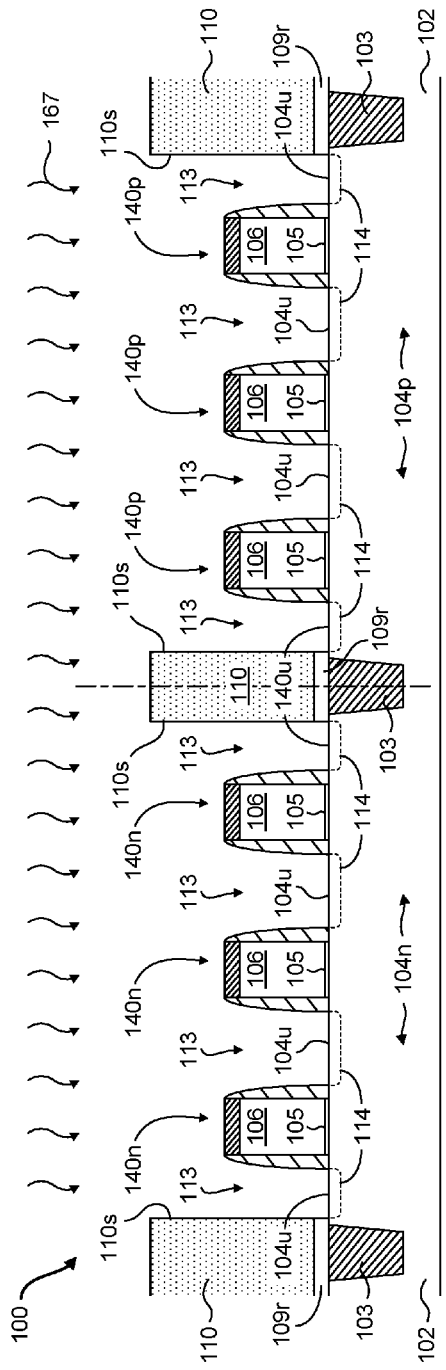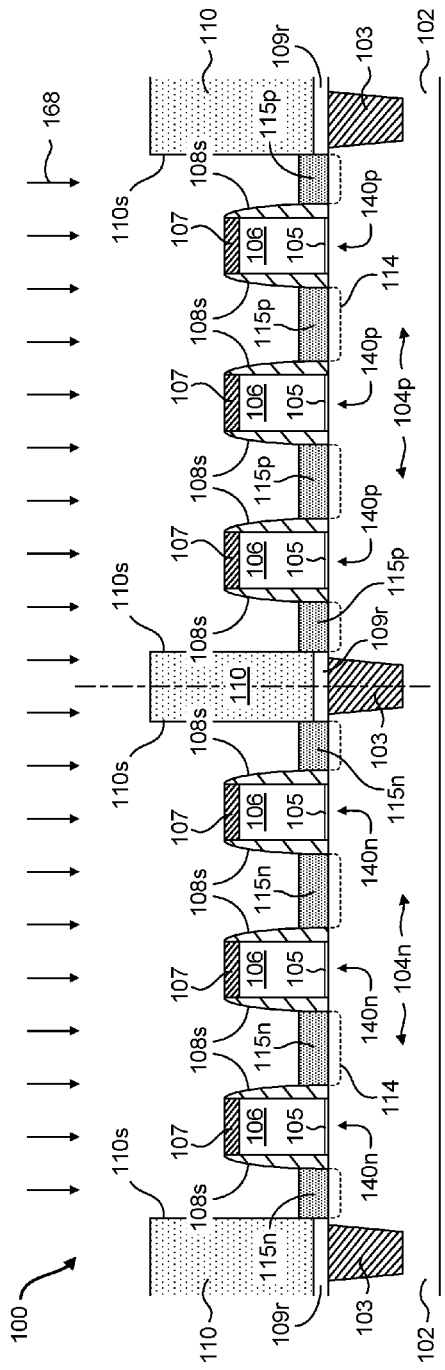

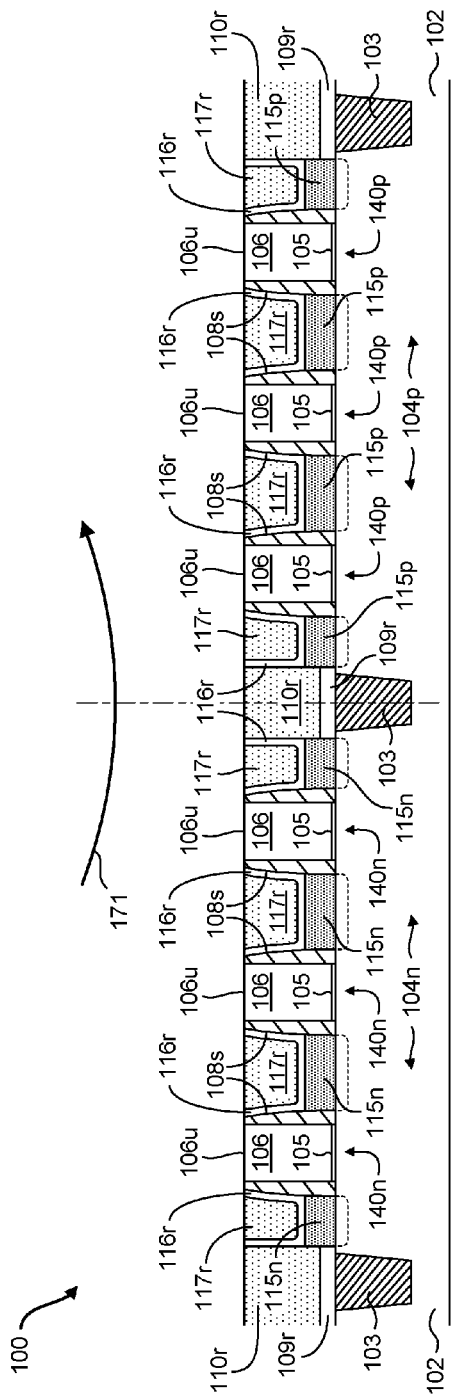
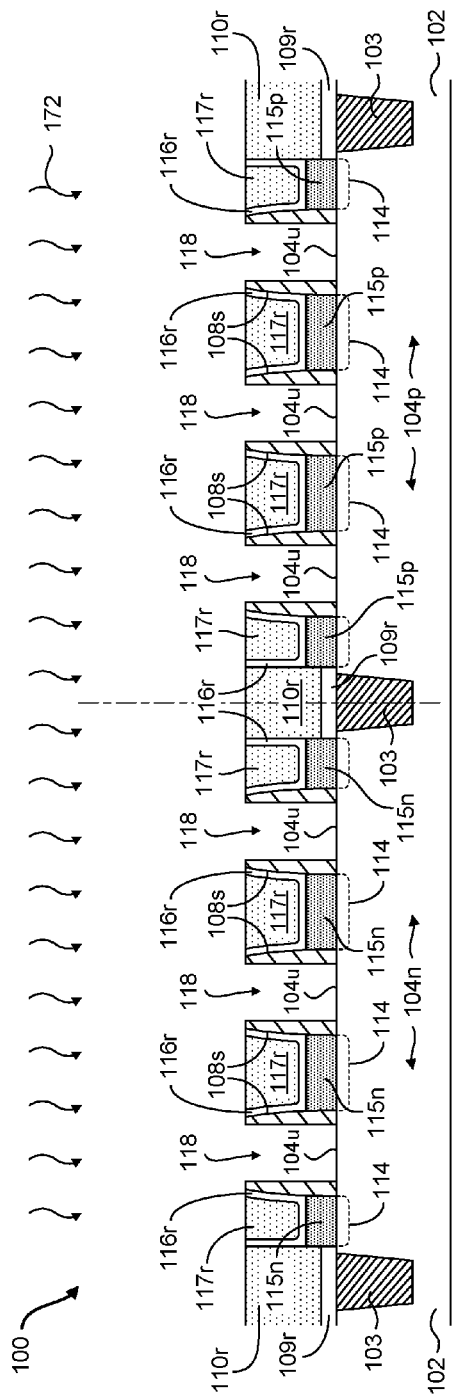
Fig. 2C
Fig. 2D

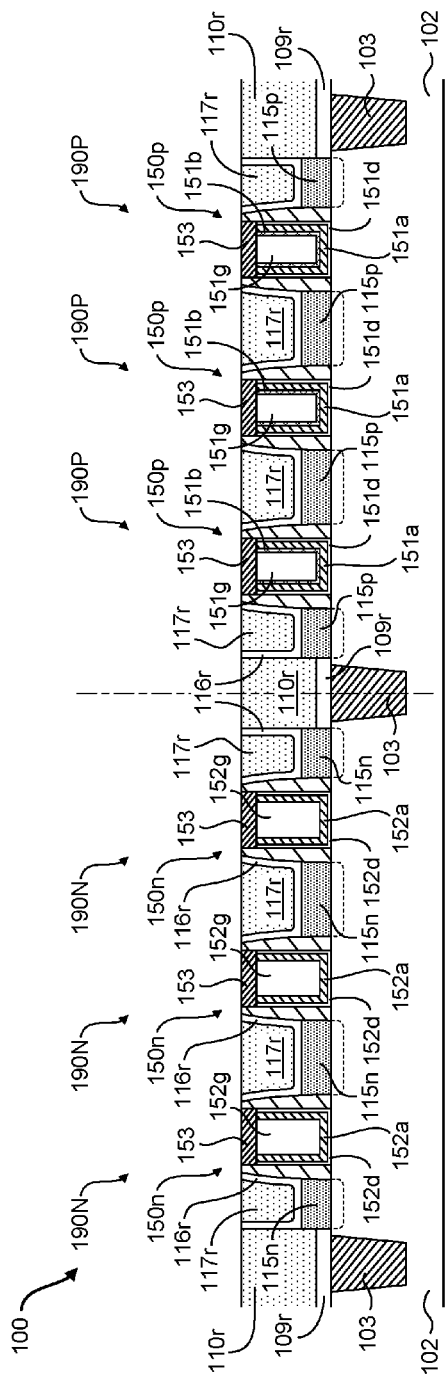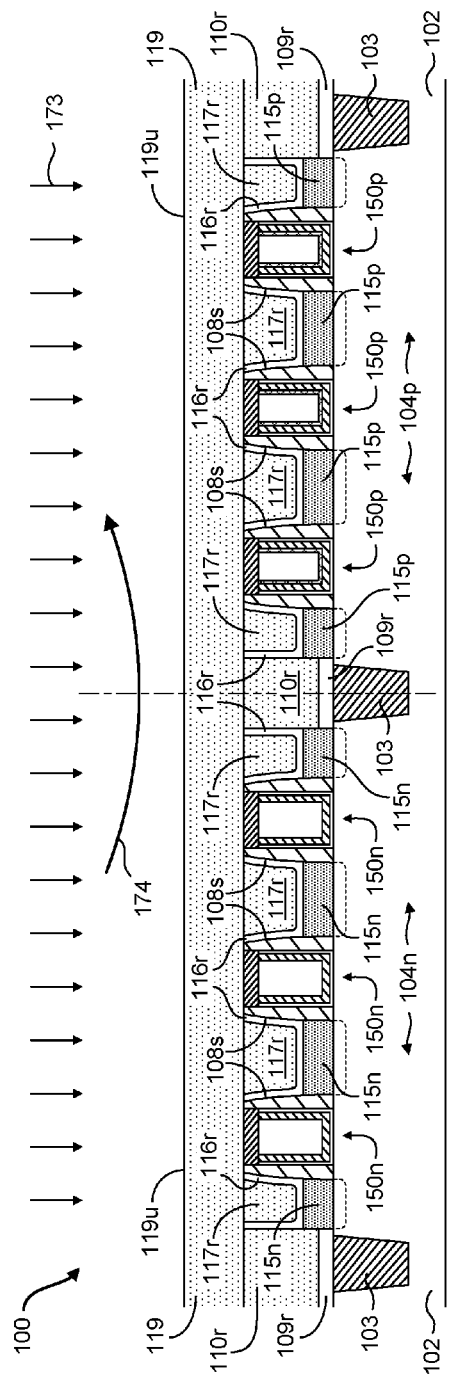

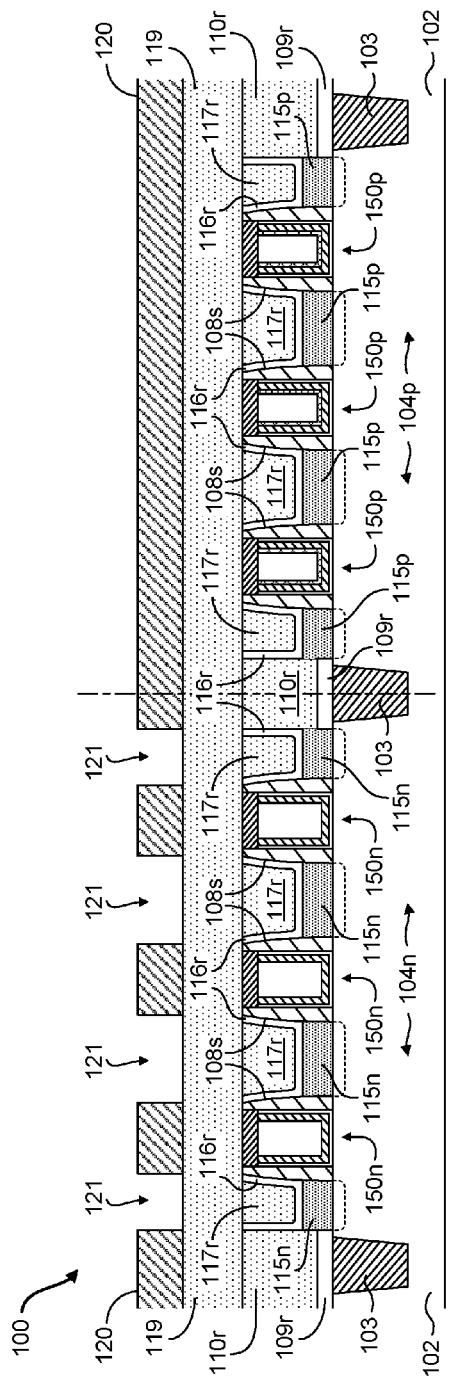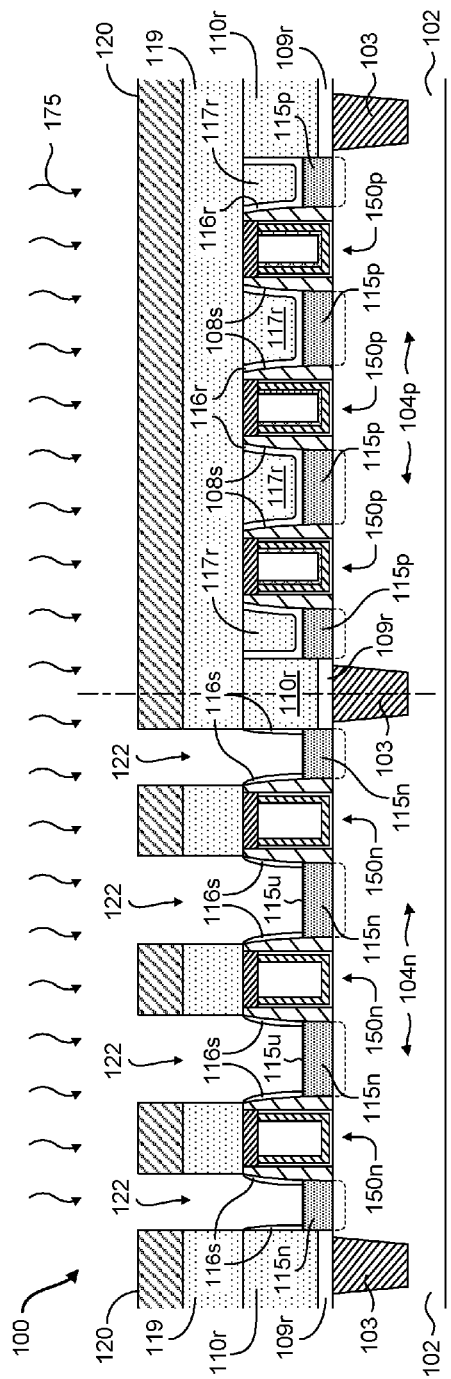

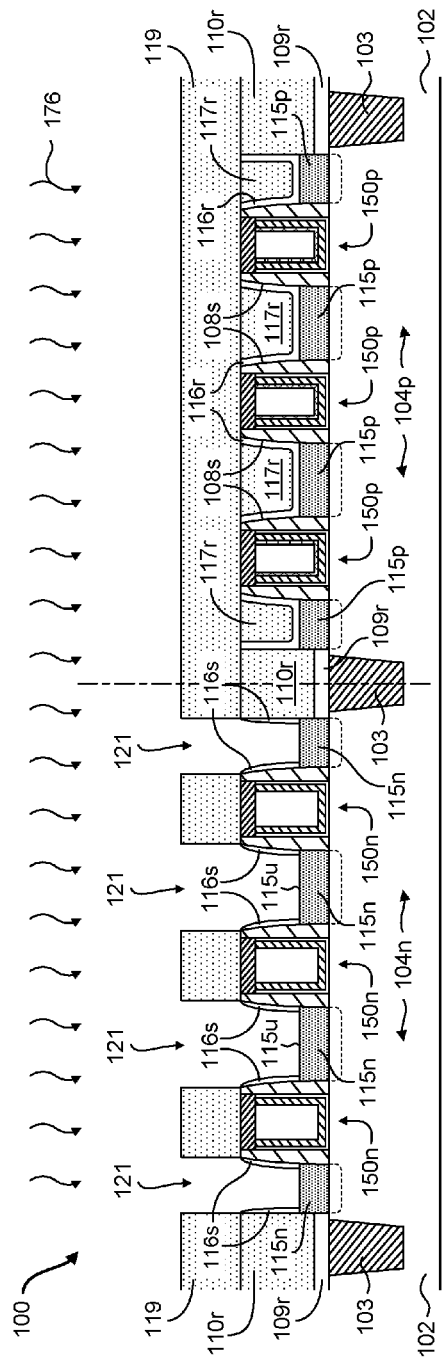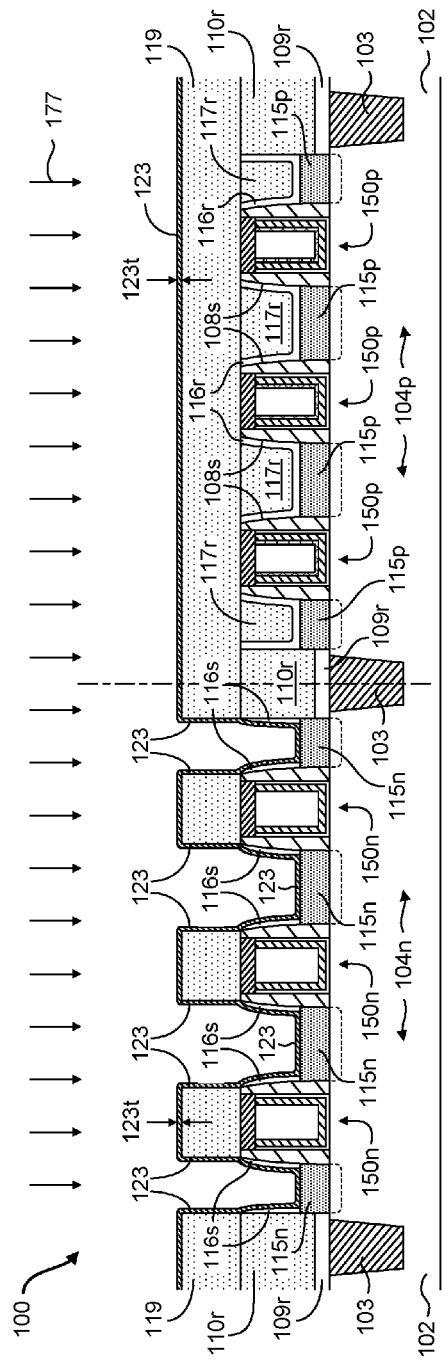

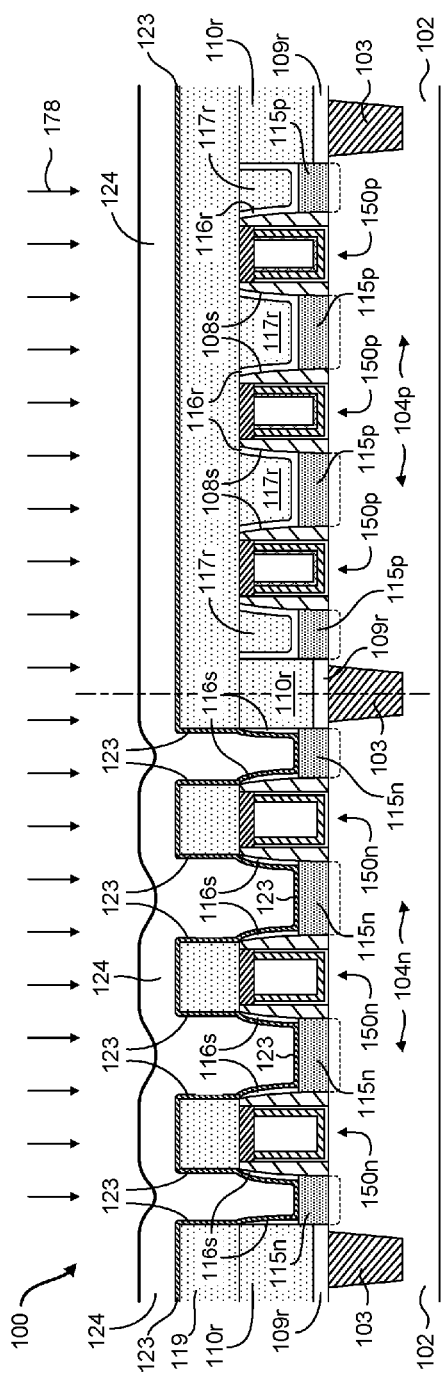
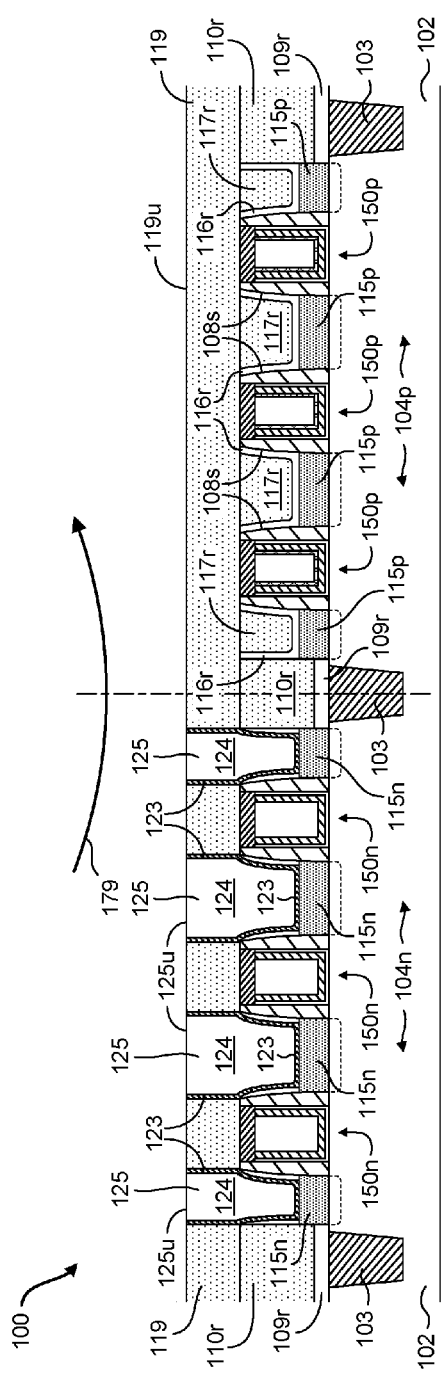

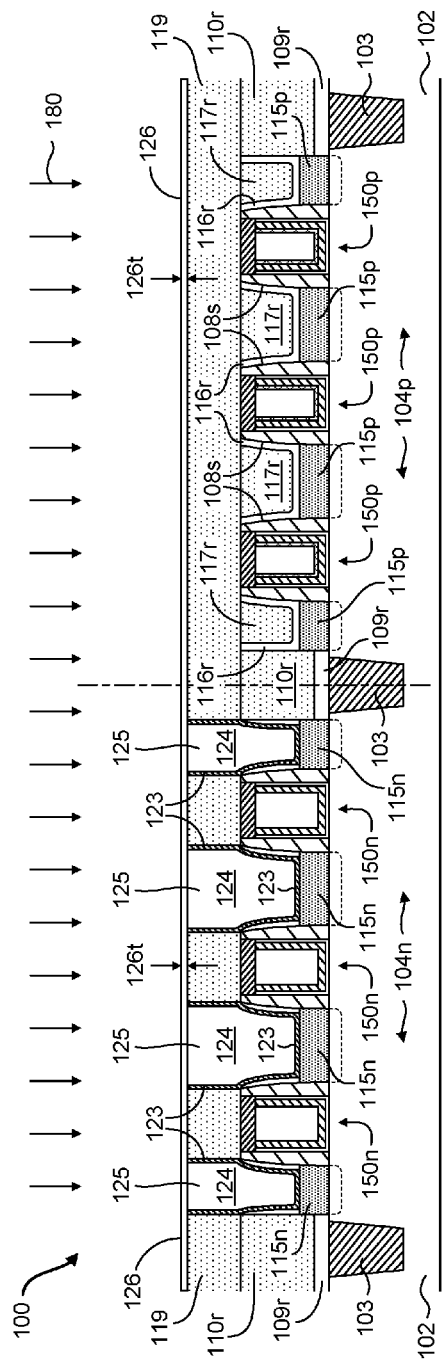
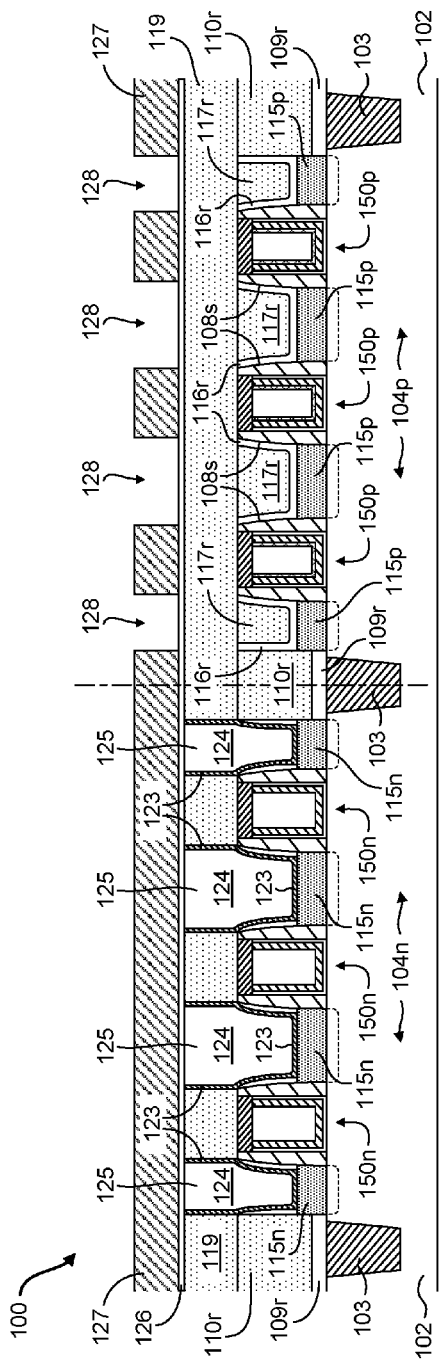
Fig. 2M
Fig. 2N

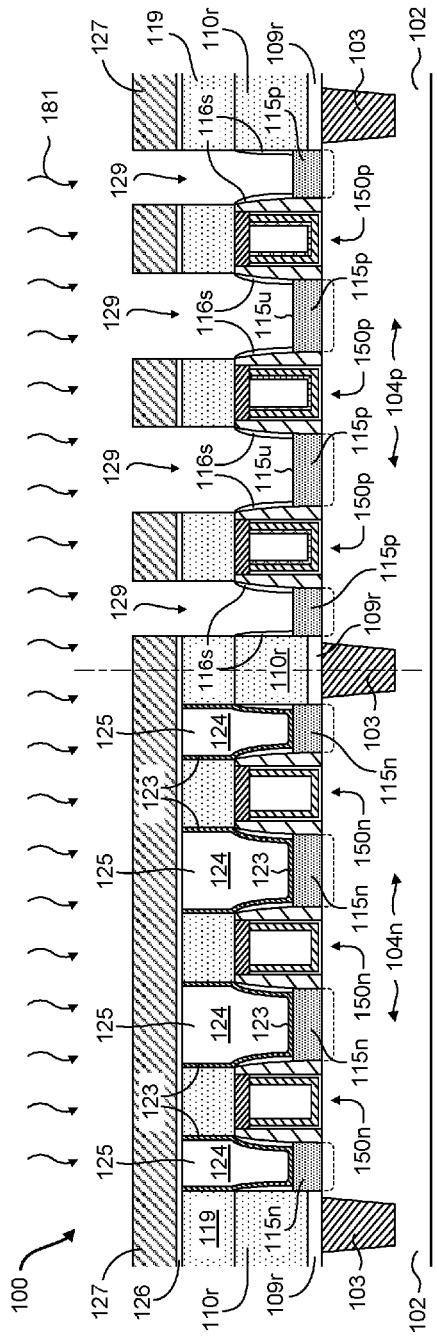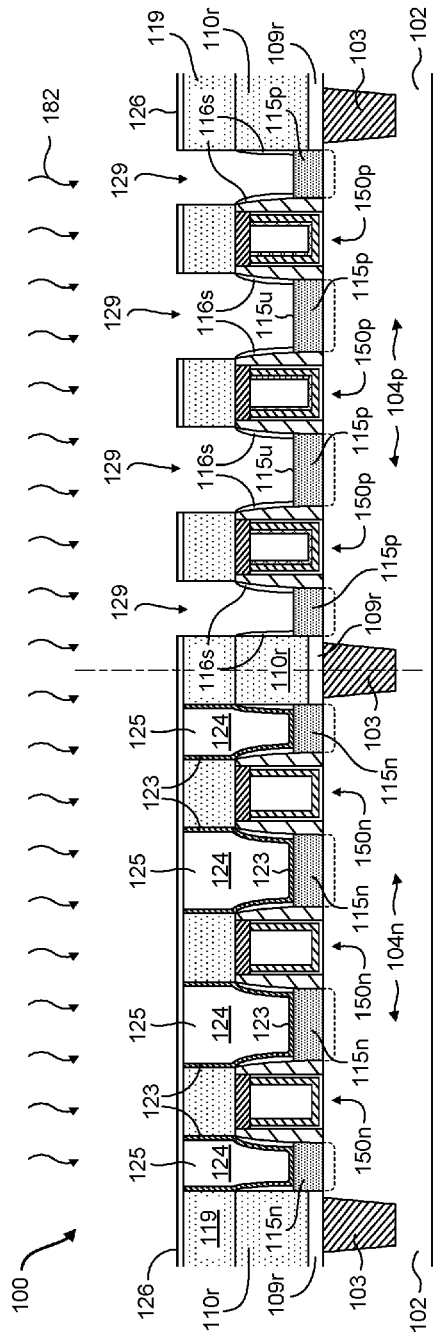

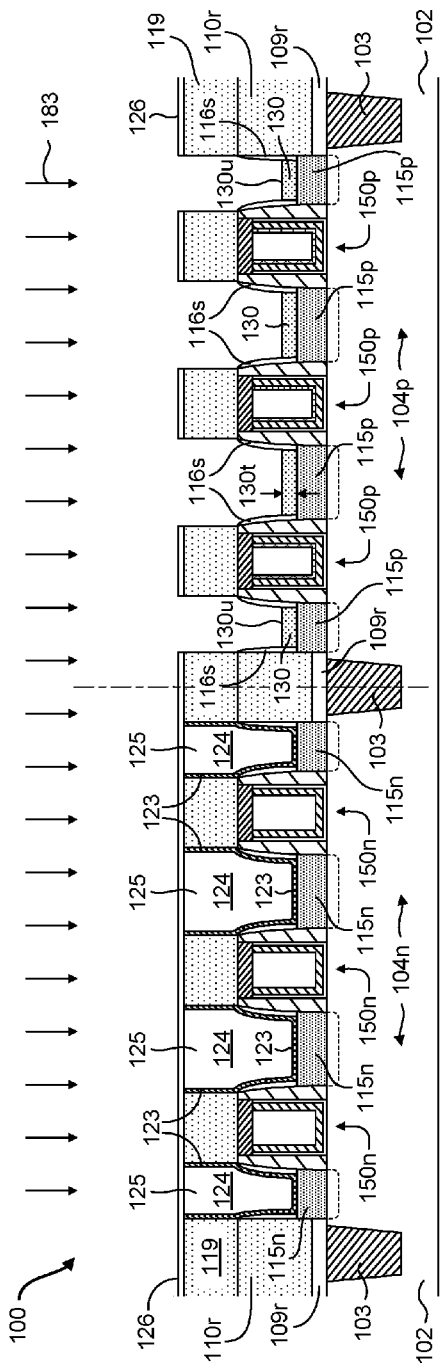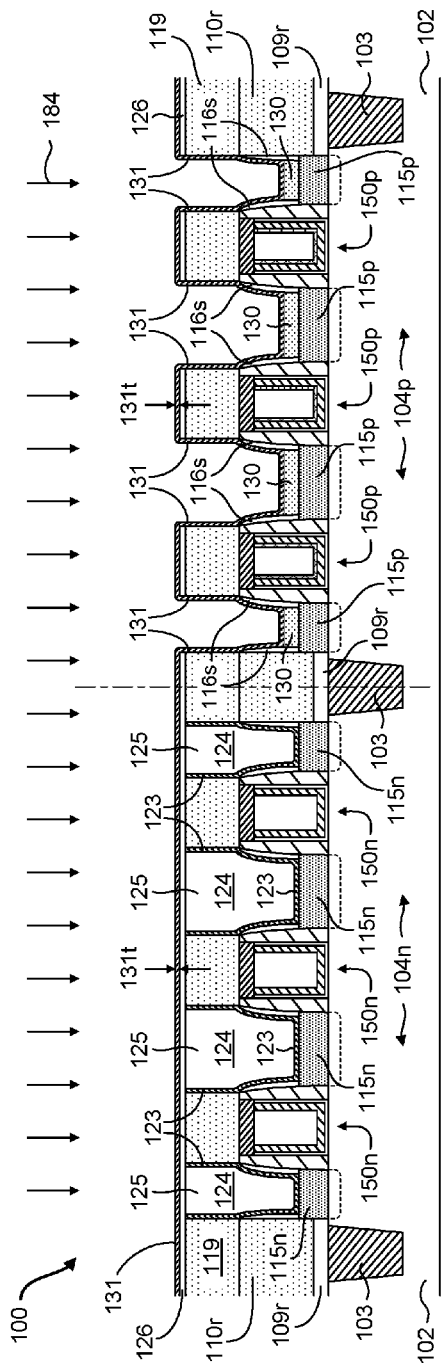

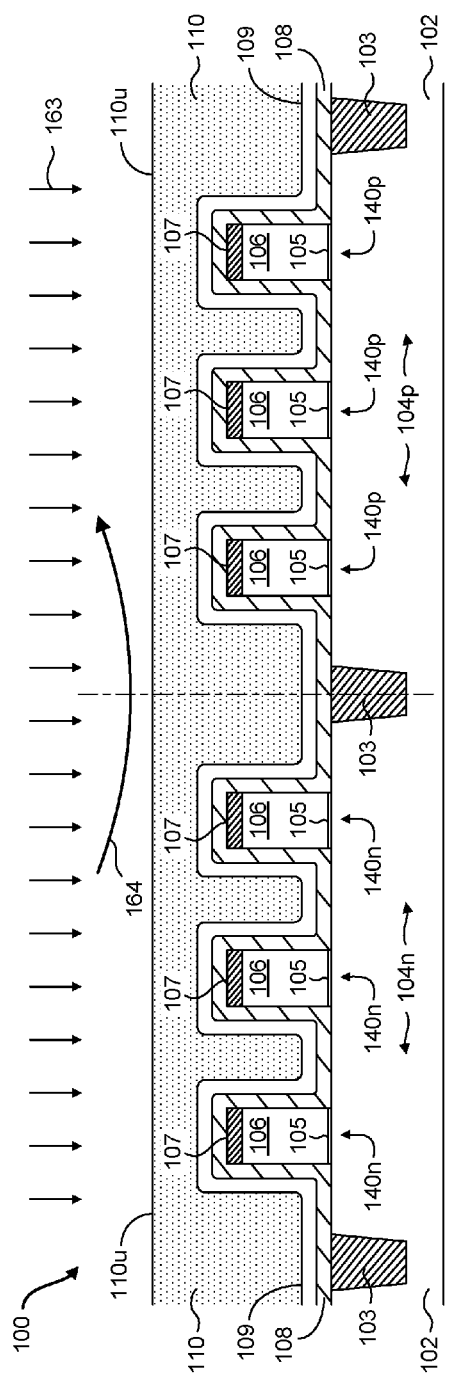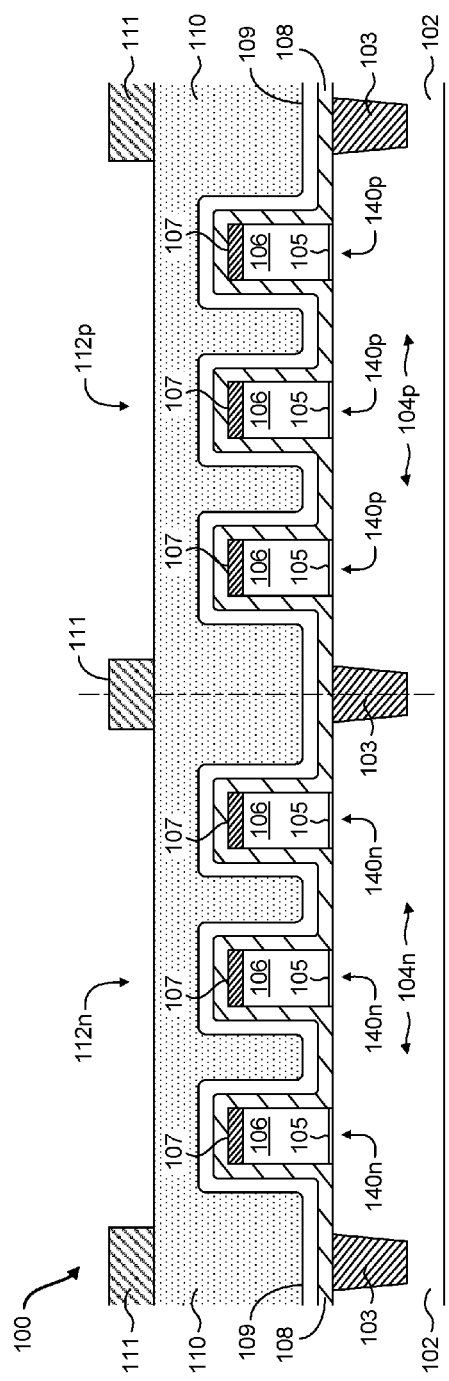
Fig. 3C
Fig. 3D

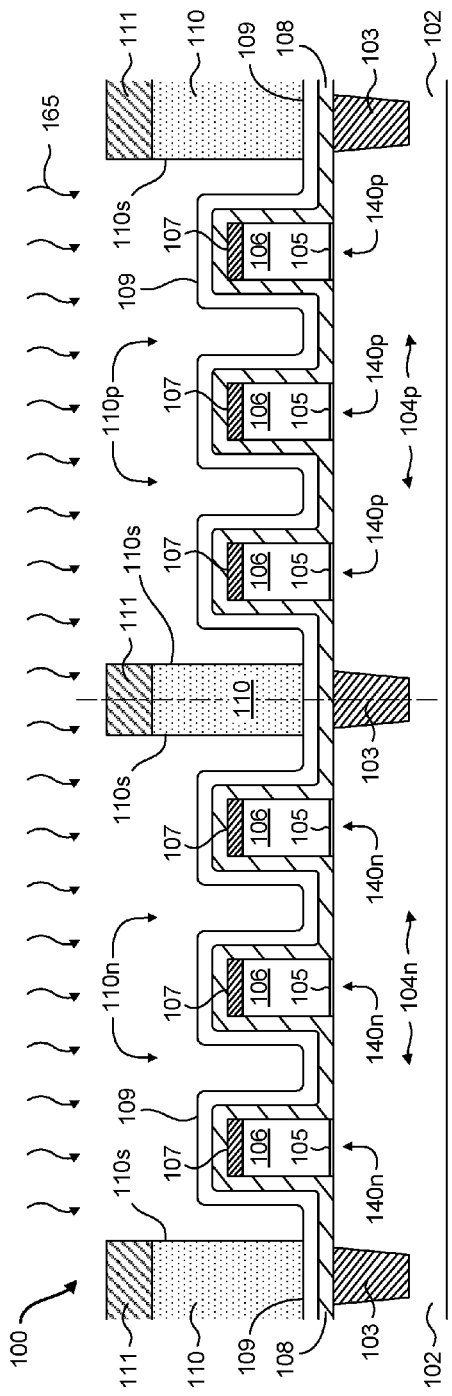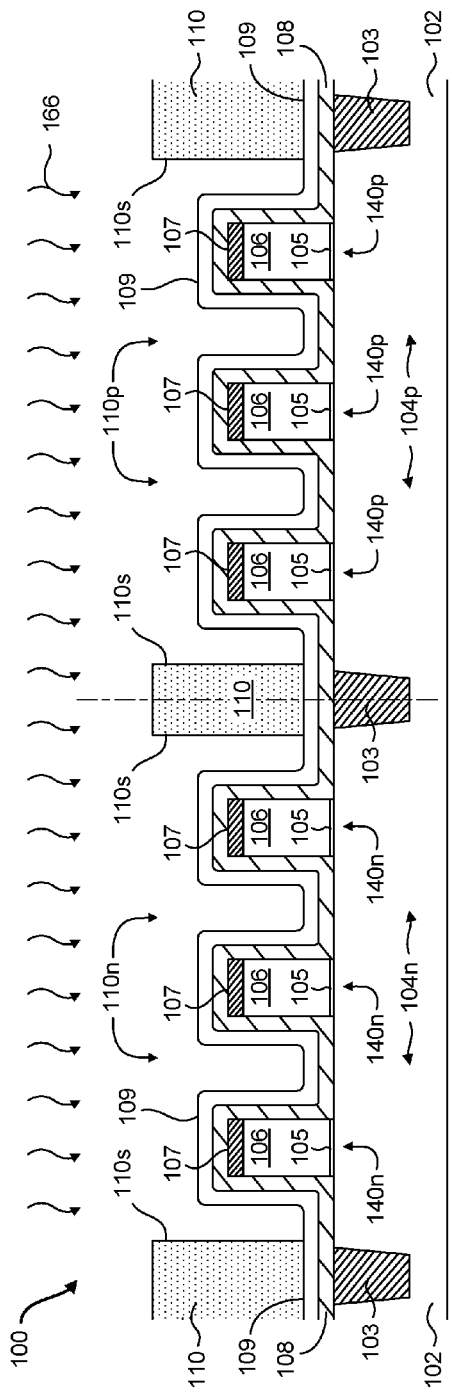

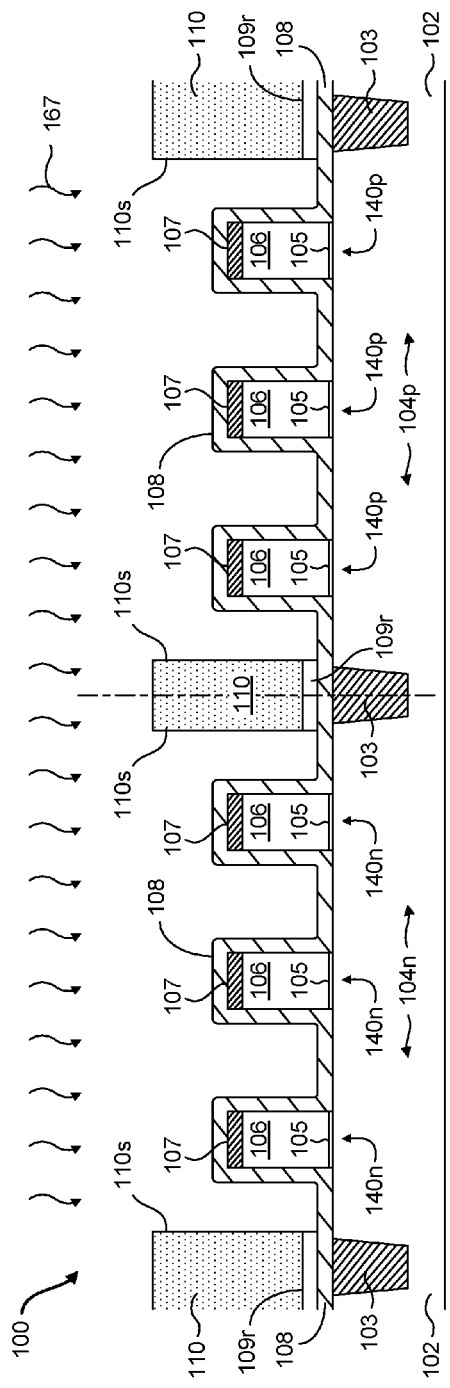
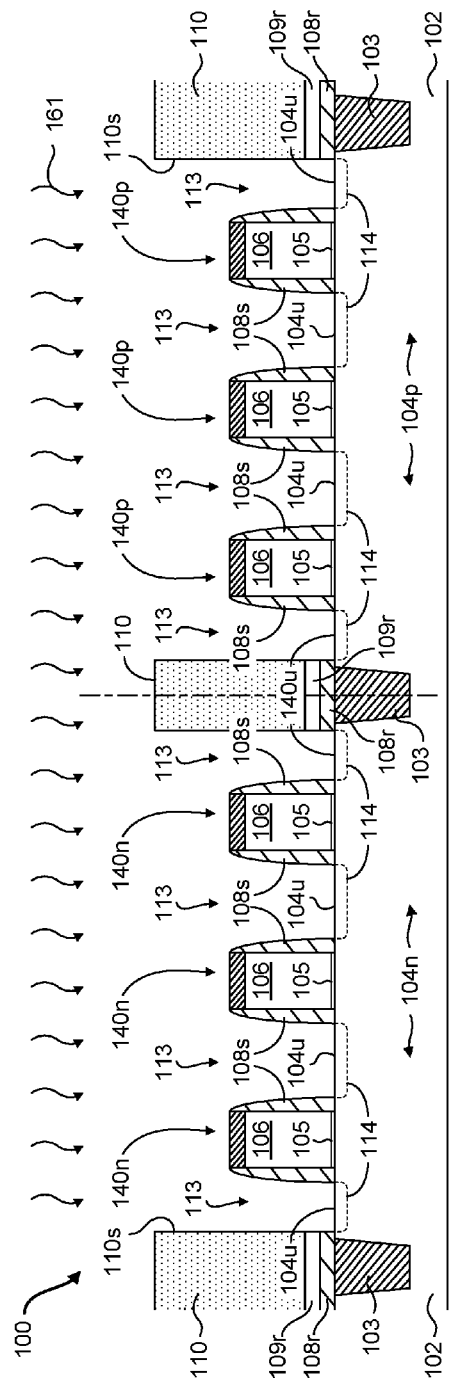
Fig. 3G
Fig. 3H

METHOD FOR FORMING SOURCE/DRAIN CONTACTS DURING CMOS INTEGRATION USING CONFINED EPITAXIAL GROWTH TECHNIQUES AND THE RESULTING SEMICONDUCTOR DEVICES

BACKGROUND

1. Field of the Disclosure

The present disclosure generally relates to the fabrication of integrated circuits, and more particularly, to various methods for forming source/drain contacts during CMOS integration and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, Metal-Oxide-Semiconductor (MOS) technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit either a high conductive state (on-state) or a high impedance state (off-state). The state of the field effect transistor is controlled by a gate electrode, which controls, upon application of an appropriate control voltage, the conductivity of a channel region formed between a drain region and a source region of the device.

To improve the operating speed of FETs, and to increase the density of FETs on an integrated circuit device, designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET device, a generally vertically positioned fin-shaped active area is formed and a gate electrode encloses both sides and an upper surface of the fin-shaped active area to form what is sometimes referred to as a "tri-gate" structure, such that the channel has a three-dimensional structure instead of a planar structure. In some cases, an insulating cap layer, e.g., silicon nitride, is positioned at the top of the fin, in which case the FinFET device only has what is sometimes referred to as a "dual-gate" structure. Unlike a planar FET, in a FinFET device, the channel is formed perpendicular to a surface of the semiconducting substrate so as to reduce the physical size of the device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times ($2x$) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is generally a superior MOSFET structure as compared to that of a typical planar FET, especially in aggressively sized devices, such as the 20/22 nm Complementary MOS (CMOS) technology node and beyond.

By using such field effect transistors, more complex circuit components may be composed, such as inverters and the like, thereby forming complex logic circuitry, embedded memories and the like. Over the recent years, due to the reduced dimensions of the transistor devices, the operating speed of the circuit components has been increased with every new device generation, and the "packing density" in such products has been commensurately increased. Such improvements in the performance of transistor devices has reached the point where the limiting factor of the finally achieved operating speed of complex integrated circuit products is not always based solely on the individual transistor element configuration(s), but is instead often a function of the electrical performance of the complex wiring system that is formed above the device level that includes the actual semiconductor-based circuit elements. Due to the large number of circuit elements and the required complex layout of modern integrated circuits, the electrical connections of the individual circuit elements cannot be established within the same device level on which the circuit elements are manufactured, but generally require a metallization system that includes one or more metallization layers that are positioned above the device level. Typically, a metallization layer includes a plurality of conductive structures that are embedded in a layer of dielectric insulating material, and are generally one of two types. "Intra-level" connections are substantially horizontal metal-containing structures—sometimes referred to as "lines"—that provide electrical connections within a given metallization layer. "Inter-level" connections are substantially vertical metal-containing structures—sometimes referred to as vias—that provide electrical connections between the various adjacent stacked metallization layers.

Furthermore, in order to actually connect the circuit elements formed in the semiconductor material with the metallization layers, an appropriate vertical device level contact structure is provided, a first end of which is connected to a respective contact region of a circuit element, such as a gate electrode and/or the drain and source regions of transistors, and a second end that is connected to a respective metal line in the first metallization layer. In some applications, the second end of the contact structure may be connected to a contact region of a further semiconductor-based circuit element, in which case the interconnect structure in the contact level between the device level and the overlying metallization system is also referred to as a local interconnect. The contact structure may include contact elements or contact plugs having a generally square-like or round shape that are formed in an interlayer dielectric material, which in turn encloses and passivates the circuit elements. As the critical dimensions of the circuit elements in the device level have decreased, the dimensions of metal lines, vias and contact elements have also been reduced. In some cases, the increased packing density has mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with the desired circuit element density in the device level.

As device dimensions have decreased, e.g., transistors with gate lengths of 50 nm and less, the contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements, e.g., source regions, drain regions, and/or gate electrodes, and the like. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a "self-aligned" fashion by removing the interlayer dielectric material, such as silicon dioxide, selectively from the spaces between closely spaced gate electrode structures. That is, after completing the transistor structure, the gate electrode structures are used as etch masks for selectively removing the interlayer dielectric material in order to expose the contact regions of the transistors, thereby providing self-aligned trenches which are substantially laterally delineated by the spacer structures of the gate electrode structures. Consequently, a corresponding lithography process only needs to define a global contact opening above an active region, and the contact trenches then result from the selective etch process using the gate electrode structures, i.e., the portions exposed by the global contact opening, as an etch mask. Thereafter, an appropriate contact material, such as tungsten and the like, may be filled into the contact trenches that are formed in this manner.

While the use of self-aligned contact elements has generally led to a reduction in some types of device defects and/or increased product yield, other processing-related issues and defects are sometimes associated with the use of typical contact self-alignment techniques as MOSFET devices are continuously being aggressively scaled. For example, as transistor devices become smaller and packing density increases, the space available between gate electrode structures to form the sidewall spacers that electrically isolate the self-aligned contact elements from the gate electrodes also becomes commensurately smaller, often resulting in spacers having a nominal thickness on the order of approximately 10 nm or even less. Due to such reduced spacer thicknesses, device designers have turned more to the use of low-k dielectric materials for sidewall spacer construction, rather than a more traditional silicon nitride material. However, in light of the very small target sidewall spacer thicknesses on such devices, very tight processing controls over the final spacer thickness is often necessary in order to minimize detrimental variations in the parasitic capacitance between contact elements and gate electrodes, and/or the threshold voltage of the resulting devices. Furthermore, while the type of etching processes that are used to form such self-aligned contact openings may be adapted to selectively remove the interlayer dielectric material from between gate electrode structures relative to the material of the sidewall spacers, it should be understood that such selective etching processes will also often remove at least some portion of the spacer material, albeit at a lower etch rate than that of the interlayer dielectric material. As such, the final thickness of the sidewall spacers can very often be affected during self-aligned contact formation, which can ultimately affect the parasitic capacitance and/or threshold voltage of the device.

In some prior art processing schemes, a substantially anisotropic, or directional, etching process, such as reactive ion etching (RIE) process and the like, is used to selectively remove the interlayer dielectric material from between the sidewall spacers, thus minimizing to some degree the amount of spacer thickness reduction that occurs when forming the self-aligned contact openings. However, the RIE process often damages the upper surface of the contact regions, e.g., the source/drain regions, that are exposed by the etching process. Such surface damage from an REI process can adversely affect the Schottky barrier height at the metal/semiconductor interface between the contact element and the transistor contact regions, thus potentially creating a rectifying contact where an ohmic contact is otherwise generally desired. Furthermore, a higher Schottky barrier height for the metal/semiconductor contacts of PMOS devices can be particularly problematic, as the p-type metal of PMOS contact elements typically has a relatively high Schottky barrier height, which can thus lead to a greater overall resistance between the conductive metal of the contact elements and the contact regions of the transistor device.

Another problem associated with the continued aggressive scaling of transistor devices is that the electrical resistance between the conductive contacts and the transistor element can have a greater influence on the overall electrical resistance of the device. Traditionally, low resistance metal silicide layers are formed in the underlying silicon or epitaxially grown semiconductor material of the source/drain regions of a device. Ideally, one could simply increase the contact area between the low-resistance metal silicide layer and the underlying silicon or epitaxially grown semiconductor material. However, such an approach can become problematic in the case of aggressively scaled FinFET devices, as the spacing between fins can often be quite small, such as on the order of about 15 nm or less, which leaves a very small process margin for most conventional source/drain epitaxial material growth schemes. In such cases, and considering all of the material overlay and critical dimension variations that may be associated with the device processing, the conventional epitaxial schemes cannot be reliably used to provide any more than approximately 10 nm of epitaxial growth thickness on the fins, otherwise the risk for creating an electric short between the epi material on adjacent fins (junction to channel)—i.e., fin merger—may be too great. However, such a relatively thin (e.g., approximately 10 nm or less) epi layer results in a very small volume of epi material being formed on each fin, a situation which can tend to lower the area available for silicide formation and thus increase the overall resistance at the metal/semiconductor contact interface. Furthermore, such a thin epi material layer may be substantially consumed during the silicide formation process and/or damaged during the contact etch step.

The present disclosure is generally directed to various methods for forming source/drain contacts so as to substantially avoid, or at least reduce, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein is directed to various methods for forming source/drain contacts during CMOS integration and the resulting semiconductor devices. In one illustrative embodiment, a semiconductor device is disclosed that includes, among other things, an isolation region laterally defining an active region in a semiconductor substrate, a gate structure positioned above the active region, and a sidewall spacer positioned adjacent to sidewalls of the gate structure. The exemplary semiconductor device further includes an etch stop layer positioned above and covering a portion of the active region, an interlayer dielectric material positioned above the active region and covering the etch stop layer, and a confined raised source/drain region positioned on and in contact with an upper surface of the active region. The confined raised source/drain region extends laterally between and contacts a lower sidewall surface portion of the sidewall spacer and at least a portion of a sidewall surface of the etch stop layer. Additionally, the semiconductor device includes a conductive contact element extending through the interlayer dielectric material and directly contacting an upper surface of the confined raised source/drain region.

Another exemplary semiconductor device disclosed herein includes a plurality of first gate structures and a plurality of second gate structures positioned above respective first and second active regions of a semiconductor substrate. Additionally, the disclosed semiconductor device further includes, among other things, a plurality of first raised source/drain regions and a plurality of second raised source/drain regions positioned adjacent to and between each of the respective pluralities of first and second gate structures, wherein each of the first and second raised source/drain regions includes a first semiconductor material. Furthermore, at least a first one of each of the pluralities of first and second raised source/drain regions is laterally confined between and in direct contact with sidewall spacers positioned adjacent to each of the respective pluralities of first and second gate structures. Moreover, a layer of a second semiconductor material is positioned on an upper surface of each of the plurality of second raised source/drain regions, wherein the height level of an upper surface of the layer of second semiconductor material above the upper surface of the second active region is greater than the height level of the upper surface of the first raised source/drain region above the upper surface of the first active region. The exemplary semiconductor device also includes a first contact element that directly contacts the upper surface of a respective one of the plurality of first raised source/drain regions, and a second contact element that directly contacts the upper surface of the layer of second semiconductor material positioned above a respective one of the plurality of second raised source/drain regions.

Also disclosed herein is an illustrative semiconductor device that includes, among other things, a plurality of PMOS gate structures positioned above a PMOS active region defined in a semiconductor substrate, and a plurality of NMOS gate structures positioned above an NMOS active region defined in the semiconductor substrate. Furthermore, a first interlayer dielectric material is positioned above the PMOS and NMOS active regions, wherein the first interlayer dielectric material covers the pluralities of PMOS and NMOS gate structures. The exemplary semiconductor device also includes, among other things, an etch stop layer that is positioned between the first interlayer dielectric material and the upper surface of each of the PMOS and the NMOS active regions, the etch stop layer including a high-k dielectric material and having a first etch stop layer portion that covers a portion of the PMOS active region and a second etch stop layer portion that covers a portion of the NMOS active region. Additionally, a plurality of first raised source/drain regions that each include a first semiconductor material are positioned on the upper surface of the PMOS active region, wherein the plurality of first raised source/drain regions are laterally confined by sidewalls of at least the first etch stop layer portion and first sidewall spacers positioned adjacent to sidewalls of each of the plurality of PMOS gate structures. Moreover, a layer of semiconductor material that includes one of boron doped germanium and boron doped silicon-germanium is positioned above each of the plurality of first raised source/drain regions, and a plurality of first contact elements extend through a second interlayer dielectric material positioned above the first interlayer dielectric material, each of the plurality of first contact elements directly contacting the upper surface of the layer of semiconductor material positioned above a respective one of the plurality of first raised source/drain regions. Additionally, a plurality of second raised source/drain regions that each include a second semiconductor material are positioned above the upper surface of the NMOS active region, wherein the plurality of second raised source/drain regions are laterally confined by sidewalls of at least the second etch stop layer portion and second sidewall spacers positioned adjacent to sidewalls of each of the plurality of NMOS gate structures. Finally, a plurality of second contact elements extend through the second interlayer dielectric material, each of the plurality of second contact elements directly contacting the upper surface of a respective one of the plurality of second raised source/drain regions.

BRIEF DESCRIPTION OF THE DRAWINGS

The disclosure may be understood by reference to the following description taken in conjunction with the accompanying drawings, in which like reference numerals identify like elements, and in which:

FIGS. 1A-1J are schematic cross-sectional views depicting various illustrative early stage processing steps for forming a CMOS device by performing confined epitaxial growth techniques to form raised source/drain regions prior to forming replacement high-k/metal gate structures in accordance with one exemplary embodiment disclosed herein;

FIGS. 3A-3I are schematic cross-sectional views that show another illustrative embodiment of the various early stage processing steps for forming the CMOS device of FIGS. 2A-2T by performing confined epitaxial growth techniques to form raised source/drain regions prior to forming replacement high-k/metal gate structures.

Figure 1E:
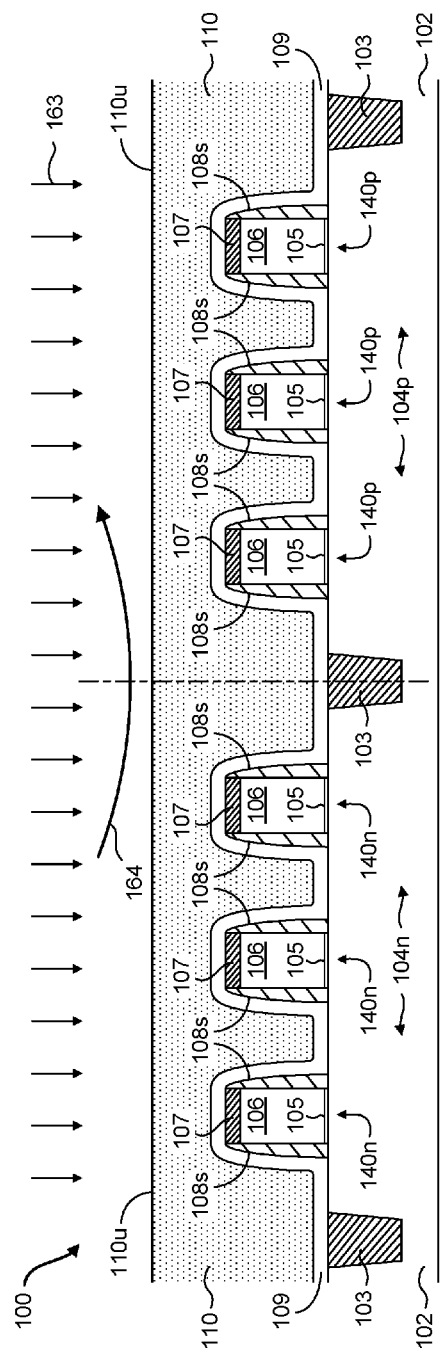

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It should be understood that, unless otherwise specifically indicated, any relative positional or directional terms that may be used in the descriptions below—such as "upper," "lower," "on," "adjacent to," "proximate," "above," "below," "over," "under," "top," "bottom," "vertical," "horizontal," and the like—should be construed in light of that term's normal and everyday meaning relative to the depiction of the components or elements in the referenced figures. For example, referring to the schematic cross-sectional view of the semiconductor device 100 depicted in FIG. 1B, it should be understood that the dummy gate structures 140p are formed "above" the device active region 104p, and the dummy gate insulation layer 105 of each dummy gate structure 140p is positioned "below" or "under" the dummy gate electrode 106. Similarly, it should also be noted that the layer of spacer material 108 may be positioned "on" the sidewalls of the dummy gate structures 106 or the gate cap layers 107 in those embodiments wherein no other layers or structures are interposed therebetween.

The present disclosure generally relates to various methods for forming source/drain contacts during a CMOS integration scheme by using confined epitaxial growth techniques, and the resulting semiconductor devices. Moreover, as will be readily apparent to those skilled in the art upon a complete reading of the present application, the presently disclosed methods may be employed in manufacturing a variety of different devices, e.g., memory devices, logic devices, ASICs, etc. As will be further appreciated by those skilled in the art after a complete reading of the present application, the inventions disclosed herein may be employed in forming integrated circuit products using planar transistor devices or a variety of 3D devices, such as FinFETs. Of course, the inventions disclosed herein should not be considered to be limited to the illustrative examples depicted and described herein. With reference to the attached figures, various illustrative embodiments of the methods and devices disclosed herein will now be described in more detail.

FIGS. 1A-1J schematically depict various illustrative early stage processing steps for forming a CMOS device by performing confined epitaxial growth techniques prior to forming raised source/drain regions prior to forming replacement metal gates in accordance with one exemplary embodiment disclosed herein.

FIG. 1A schematically illustrates a cross-sectional view of a semiconductor device 100 at an early stage of device manufacturing. The device 100 includes a substrate 102, which may have any one of a variety of configurations. For example, the substrate 102 may have a so-called bulk substrate configuration as is depicted in FIG. 1A, or it may have a silicon-on-insulator (SOI) configuration, wherein semiconductor devices are formed in and above an active layer of the SOI substrate. Furthermore, the substrate 102 may be made of a semiconducting material such as silicon, or it may be made of semiconductor materials other than silicon, such as germanium and/or silicon-germanium. Thus, the terms "substrate," "semiconductor substrate" or "semiconducting substrate" should be understood to cover all semiconducting materials and all forms and configurations of such materials.

With continuing reference to FIG. 1A, an isolation region 103 may be formed in the substrate 102 which, in certain embodiments, may define a plurality of active device regions in the substrate 102, such as the active device region 104p and the active device region 104n. At the processing stage depicted in FIG. 1A, a plurality of so-called "dummy" or "sacrificial" gate structures 140p have been formed above the active device region 104p and a plurality of "dummy" or "sacrificial" gate structures 140n have been formed above the active device region 104n. Each of the dummy gate structures 140p are temporary placeholder elements that are used during some early processing stages of forming a plurality of respective PMOS transistor devices 190P in and above the active region 104p. Therefore, as the term "sacrificial" implies, each of the dummy gate structures 140p will eventually be removed from above the active region 104p and replaced with PMOS replacement metal gate (RMG) structures 150p for each of the respective PMOS transistor devices 190P. Similarly, the dummy gate structures 140n are also temporary placeholder elements that are used during the early stages of forming a plurality of NMOS transistor devices 190N in and above the active region 104n, and will likewise be removed and replaced with NMOS replacement metal gate structures 150n for each of the respective NMOS transistor devices 190N. See, e.g., FIGS. 2A-2E, which are further described below, wherein the active region 104p may sometimes be referred to as a PMOS device region 104p and the active region 104n may be referred to as an NMOS device region 104n. Accordingly, it should therefore be understood that active region 104p is an n⁻ doped n-well, and the active region 104n is a p⁻ doped p-well.

As shown in FIG. 1A, each of the dummy gate structures 140p and 140n may include a dummy gate insulation layer 105 formed above the respective active regions 104p/104n and a dummy gate electrode 106 formed above each of the respective dummy gate insulation layers 105. In certain embodiments, the dummy gate insulation layer 105 may include one or more layers of a dielectric insulating material, such as, for example, silicon dioxide and/or silicon oxynitride and the like, and the dummy gate electrodes 106 may be formed of a sacrificial gate electrode material, such as silicon, polysilicon, amorphous silicon and the like. Additionally, a gate cap layer 107 may also be formed above each of the dummy gate structures 140p and the dummy gate structures 140n. The gate cap layer 107 may be any suitable material based on the desired replacement gate process flow. See, FIGS. 2A-2E. For example, in some embodiments, the gate cap layer 107 may be a layer of silicon nitride material, whereas, in certain other embodiments, the gate cap layer 107 may include two or more layers of material having different etch selectivities, each of which may act as an etch stop during various subsequent device processing stages.

The dummy gate structures 140p and 140n may be formed in any typical manner known in the art. For example, a dummy gate and cap layer stack (not shown) may be formed above the substrate 102 by blanket depositing a layer of the dummy gate insulation material 105, followed by a layer of the dummy gate electrode material 106 and a layer of the gate cap material 107. Next, a patterned etch mask, such as a photoresist mask and the like (not shown), may be formed above the dummy gate and cap layer stack so as to define the size and position of each of the various dummy gate structures 140p and 140n. Thereafter, an anisotropic etching process may be performed so as to form each of the dummy gate structures 140p and 140n with gate cap layers 107 positioned thereabove.

In some illustrative embodiments, the dummy gate structures 140p and 140n may have respective gate lengths 141p and 141n in the range of approximately 10-20 nm and respective gate pitches 142p and 142n ranging anywhere from about 40 nm to 50 nm, depending on the specific design node and overall device requirements. However, it should be understood that the gate length and gate pitch size ranges listed herein are exemplary only, as the actual device dimensions may be either larger than or smaller than the dimensional ranges listed. Furthermore, it should also be appreciated that the gate lengths 141p for each of the respective dummy gate structures 140p may be the same, or each may be different. Similarly, the gate pitches 142p between each of the adjacent dummy gate structures 140p may also be the same or different. Moreover, the respective gate lengths 141n of each dummy gate structure 140n and the respective gate pitches 142n between adjacent dummy gate structures 140n may also vary.

FIG. 1B schematically depicts the device 100 of FIG. 1A in a further device processing stage, wherein a deposition process 160 is performed so as to form a layer of spacer material 108 above the active regions 104p and 104n so as to thereby cover each of the dummy gate structures 140p and 140n. In some embodiments, the deposition process 160 may be a substantially conformal deposition process, i.e., one wherein the layer thickness 108t on all surfaces (horizontal, vertical, and angled) is substantially uniform within normal processing variations and tolerances. For example, the deposition process 160 may be an atomic layer deposition (ALD) process or a plasma-enhanced chemical vapor deposition (PECVD) process, although other known conformal deposition processes may also be used. In certain illustrative embodiments, the thickness 108t of the layer of spacer material 108 may range from about 5-20 nm, depending on the desired final base thickness 108b of the sidewall spacers 108s formed during a subsequent processing step (see, FIG. 1C), as well as the pitch 142p, 142n between adjacent dummy gate structures 140p, 140n.

The layer of spacer material 108 may be any suitable type of insulation material having the appropriate insulating properties, i.e., dielectric constant, so as to meet the overall device design requirements while minimizing parasitic capacitance. For example, in certain exemplary embodiments, the layer of spacer material 108 may be a low-k dielectric material, such as silicoboron carbonitride (SiBCN), although it should be understood that other suitable low-k materials, or ultra-low-k materials having a dielectric constant k that is less than approximately 2.5, may also be used.

Referring to FIG. 1C, an etching process 161 is performed on the layer of spacer material 108 so as to define sidewall spacers 108s adjacent to the sidewalls of each of the dummy gate structures 140p and 140n. In some embodiments, the etching process 161 may be an anisotropic, or substantially directional, etching process that is adapted to remove the substantially horizontal portions of the layer of spacer material 108 from above the upper surfaces 107u of the gate cap layers 107 and from above the upper surfaces 104u of the active regions 104p and 104n between the respective adjacent dummy gate structures 140p and 140n. For example, the etching process 161 may be a dry reactive ion etching (ME) process that is adapted to directionally etch the horizontal portions of the layer of spacer material 108 while leaving substantially most of the vertical portions of the layer of spacer material 108 adjacent to the sidewalls of the dummy gate structures 140p and 140n so as to form the sidewall spacers 108s.

The final base thickness 108b of the sidewall spacers 108s—that is, the spacer thickness adjacent to the bottom of each dummy gate structure 140p and 140n and proximate the upper surfaces 104u of the active regions 104p and 104n—may be in the range of about 5-15 nm. Additionally, the lateral space or gap 108g between the outer surfaces at the base of the sidewall spacers 108 on adjacent dummy gate structures 140p, 140n—which may ultimately represent the critical dimension at the bottom of a later-formed source/drain trench contact opening 113 (see, FIG. 1I)—may range between approximately 10 nm and 20 nm. However, it should be understood that the specific base thickness 108b of the sidewall spacers 108s and the gaps 108g therebetween may vary from the above-noted exemplary dimensional ranges depending on the various design and processing parameters, such as the overall device requirements, the pitch 142p, 142n between adjacent dummy gate structures 140p, 140n, and the like. Additionally, at least the gaps 108g may also vary between adjacent dummy gate structures 140p and/or between adjacent dummy gate structures 140n.

FIG. 1D schematically illustrates the device 100 of FIG. 1C during a subsequent processing step. As shown in FIG. 1D, a further deposition process 162 is performed so as to deposit an etch stop layer 109 above both active regions 104p and 104n so as to cover the sidewall spacers 108s and gate cap layers 107 of each dummy gate structure 140p and 140n as well as the exposed upper surfaces 104u of each active region 104p, 104n adjacent to the sidewall spacers 108s. In certain illustrative embodiments, the deposition process 162 may be, for example, a highly conformal deposition process, such as an ALD process and the like, such that the thickness 109t of the etch stop layer 109 has a substantially similar thickness on horizontal, vertical and/or angled surfaces. The thickness 109t may be approximately 3 nm, although other thicknesses may be used depending on any one of the various device design and processing parameters, such as the material type of the layer 109, the type of deposition process employed, the gap size 108g between adjacent sidewall spacers 108s, and the like. The etch stop layer 109 may be made up of any suitable material that is selectively etchable with respect to a later-formed interlayer dielectric material (see, e.g., FIGS. 1E-1I, described below). For example, in at least one embodiment, the etch stop layer 109 may be a high-k dielectric material—that is, one wherein the dielectric constant k of the material is greater than approximately 10—such as aluminum oxide ($Al_2O_3$) and the like, although other suitable materials may also be used.

After forming the etch stop layer 109, a material deposition process 163 may then be performed as shown in FIG. 1E so as to blanket deposit a first interlayer dielectric (ILD) material 110 above the etch stop layer 109 in both of the device active regions 104p and 104n, thereby substantially completely covering each of the dummy gate structures 140p and 140n. The first interlayer dielectric material 110 may be any suitable type of dielectric insulating material known in the art, whereas, in typical embodiments, the first interlayer dielectric material 110 may be, for example, silicon dioxide. The deposition process 163 may be any known process having a relatively high deposition rate and good gap fill properties, such as a chemical vapor deposition (CVD) process and the like. After depositing the first interlayer dielectric material 110, a planarization process 164, such as a chemical mechanical polishing (CMP) process and/or an etching process, may be performed so as to provide the first ILD material 110 with a substantially planar upper surface 110u, thereby facilitating the subsequent photolithographic patterning of the first ILD material 110, as will be further described below.

Figure 1F:
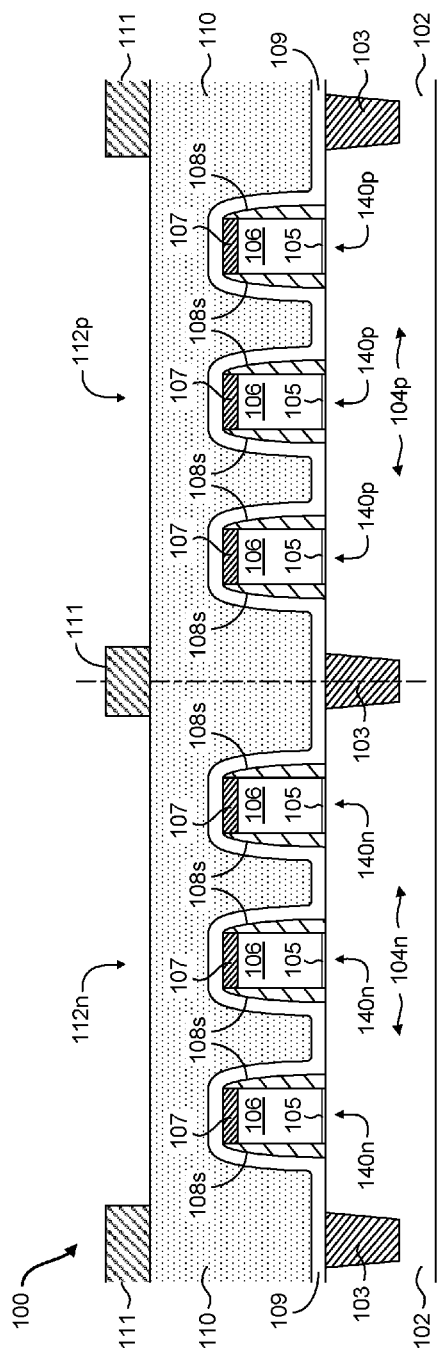

FIG. 1F schematically illustrates the device 100 of FIG. 1E in a further processing stage, wherein a patterned etch mask 111, such as a photoresist mask and the like, has been formed above the first interlayer dielectric material 110. As shown in FIG. 1F, the patterned etch mask 111 may include an opening 112p that is positioned substantially directly above the dummy gate structures 140p and sized so as to eventually facilitate the exposure of the upper surfaces 104u of the active region 104p between and/or adjacent to each of the dummy gate structures 140p in areas of the device 100 where confined raised source/drain regions 101p will eventually be formed during a later processing stage (see, FIG. 1J). Similarly, the patterned etch mask 111 may also include an opening 112n that is positioned substantially directly above the dummy gate structures 140n and sized so as to eventually facilitate the exposure of the upper surfaces 104u of the active region 104n between and/or adjacent to each of the dummy gate structures 140n in areas of the device 100 where confined raised source/drain regions 101n (see, FIGS. 1J and 2Q) will eventually be formed.

Turning now to FIG. 1G, an etching process 165 may then be performed through the openings 112p and 112n in the patterned etch mask 111 so as to form openings 110p and 110n in the first interlayer dielectric material 110 above the respective device active regions 104p and 104n. In certain embodiments, the etching process 165 may be a substantially anisotropic (directional) etching process, such as a dry reactive ion etching (ME) process, which may thus provide the ILD openings 110p and 110n with sidewalls 110s that may be substantially vertical, or only slightly angled relative to a plane that is perpendicular to the upper surfaces 104u of the first and second active regions 104p, 104n (see, FIG. 1C). Furthermore, as shown in FIG. 1G, the etch stop layer 109 may be used as an etch stop during the etching process 165, and at least a portion of the etch stop layer 109 may remain in place covering the upper surfaces 104u of the active regions 104p, 104n and/or some surfaces of the sidewall spacers 108s and gate cap layers 107 formed on the dummy gate structures 140p, 140n. In this way, the etch stop layer 109 may therefore serve to protect the semiconductor material along the upper surfaces 104u of the active regions 104p, 104n from being damaged by the deleterious effects of the dry ME process 165. Furthermore, the etch stop layer 109 may also protect the sidewall spacers 108s during the etching process 165, thus avoiding, or at least substantially minimizing, any reduction of the thickness 108b of the sidewall spacers 108s.

After completion of the etching process 165 and exposure of the etch stop layer 109, a mask removal process 166 may then be performed so as to remove the patterned etch mask 111 from above the first interlayer dielectric material 110, as shown in FIG. 1H. In those illustrative embodiments wherein the patterned etch mask 111 may be a photoresist mask, the mask removal process 165 may be any resist strip process known in the art, such as, for example, an ashing process and the like. Thereafter, as shown in FIG. 1I, a selective etching process 167 may be performed so as to remove the etch stop layer 109 from above the upper surfaces 104u of the active regions 104p, 104n and from above the sidewall spacers 108s and/or the gate cap layers 107 formed on the respective dummy gate structures 140p, 140n. In some illustrative embodiments, the selective etching process 167 may be a wet etching process that is selective to the material of the etch stop layer 109 (e.g., aluminum oxide) over the materials of the active regions 104p, 104n (e.g., silicon) and the sidewall spacers 108s (e.g., silicoboron carbonitride). For example, in at least one embodiment, the selective wet etching process 167 may be a dilute hydrofluoric (HF) acid etch that is performed at substantially ambient temperature and with an acid dilution that ranges between approximately 1:100 and 1:500.

After completion of the selective etch process 167, a portion 109r of the etch stop layer 109 remains in place between first interlayer dielectric material 110 and the areas of the substrate 102 that remain covered by first ILD material 110 during the above described processing steps, such as the isolation region 103. Furthermore, a plurality of source/drain trench contact openings 113 that expose the upper surfaces 104u of the active regions 104p, 104n are positioned between the sidewall spacers 108s of adjacent dummy gate structures 140p, 140n, as well as between the sidewalls 110s of the ILD openings 110p, 110n and the sidewall spacers 108s of the dummy gate structures 140p, 140n adjacent thereto.

In some exemplary embodiments, after the etch stop layer 109 has been selectively removed so as to form the source/drain trench openings 113, an optional etching process (not shown) may be performed so as to form recesses 114 (indicated by dashed lines in FIG. 1I) in the active regions 104p, 104n below the trench openings 113. For example, in those illustrative embodiments wherein the material of the substrate 102 may be substantially silicon, the optional etching process used to form the recesses 114 may be a hot wet ammonia etching process. In certain embodiments, the depth of the recesses 114 may range between about 5 nm and 20 nm, although both greater and lesser recess depths may also be used depending on the overall device design requirements.

FIG. 1J schematically depicts the device 100 of FIG. 1I in a further illustrative manufacturing stage, wherein a first epitaxial growth process 168 may be performed so as to epitaxially grow a semiconductor material on the upper surfaces 104u of the active regions 104p, 104n (or in and above the optional recesses 114, when provided), thereby respective confined raised source/drain regions 115p, 115n in the bottoms of the respective source/drain trenches 113 are formed above the active region 104p and the active region 104n. As shown in FIG. 1J, at least some confined raised source/drain regions 115p, 115n may be positioned adjacent to and between respective adjacent pairs of dummy gate structures 140p, 140n. Additionally, other confined raised source/drain regions 115p, 115n may be positioned adjacent to and between a respective dummy gate structure 140p, 140n and an adjacent sidewall 110s of a respective ILD opening 110p, 110n. Furthermore, since a replacement metal gate (RMG) process has not yet been performed to remove the dummy gate structures 140p, 140n and replace them with respective PMOS and NMOS replacement high-k/metal gate (HK/MG) structures 150p, 150n (see, FIGS. 2A-2E), the first epitaxial growth process 168 may be performed with a higher thermal budget, as there is generally no concern of any undue detrimental effects on temperature sensitive HK/MG materials.

In at least some illustrative embodiments, the semiconductor material of the confined raised source/drain regions 115p, 115n that are formed between adjacent pairs of dummy gate structures 140p, 140n may be substantially confined between adjacent sidewall spacers 108s such that the sidewalls of the confined raised source/drain regions 115p, 115n may be in direct contact with a lower portion of the outer sidewall surface of each of the respective adjacent sidewall spacers 108s. Additionally, the confined raised source/drain regions 115p, 115n that are formed between one of the respective dummy gate structures 140p, 140n and the adjacent sidewall 110s of a respective ILD opening 110p, 110n may be confined between the sidewalls 110s of the ILD opening 110p, 110n and the remaining portion 109r of the etch stop layer 109 on one side of the raised source/drain region 115p, 115n and the sidewall spacer 108s of an adjacent dummy gate structure 140p, 140n on another side of the raised source/drain region 115p, 115n. In such cases, the sidewalls of the respective confined raised source/drain region 115p, 115n may be in direct contact with the sidewall of the remaining etch stop layer portion 109r and the sidewall 110s on one side and the lower portion of the outer sidewall surface of the adjacent sidewall spacer 108s on the other side.

In exemplary embodiments, the type of semiconductor material used to form the confined raised source/drain regions 115p, 115n may be substantially the same type of semiconductor material that makes up the device active regions 104p, 104n. For example, when the semiconductor material of the active regions 104p, 104n is a crystalline silicon material, the epitaxially formed raised source/drain regions 115p, 115n may be substantially the same crystalline silicon material. Likewise, when the material of the active regions 104p, 104n is, e.g., a silicon-germanium semiconductor alloy, the confined raised source/drain regions 115p, 115n may also be a substantially similar silicon-germanium semiconductor alloy. However, it should be understood by those of ordinary skill in the art after a complete reading of the present disclosure that the epitaxially formed raised source/drain regions 115p, 115n may be made of a semiconductor material that is different than the semiconductor material of the active regions 104p, 104n.

Figure 2A:
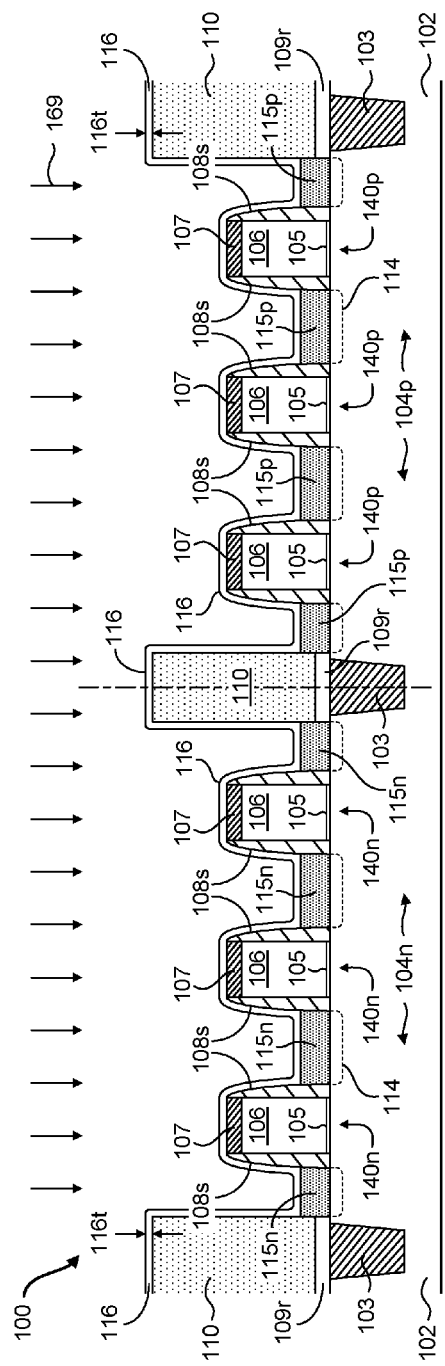
FIGS. 2A-2T are schematic cross-sectional views illustrating various exemplary further processing steps for forming contact elements to the source/drain regions of a CMOS device that are performed after the processing steps shown in FIGS. 1A-1J.

FIGS. 2A-2E are schematic cross-sectional views of the device 100 that depict various exemplary processing steps that may be used for performing a replacement metal gate (RMG) process. More specifically, FIG. 2A schematically illustrates the device 100 depicted in FIG. 1J during a further device processing stage after the confined raised source/drain regions 115p, 115n have been formed. As shown in FIG. 2A, a deposition process 169 may be performed so as to form a protective liner layer 116 above the device 100, thereby covering all exposed surfaces of the sidewall spacers 108s and gate cap layers 107 formed on the dummy gate structures 140p, 140n, the raised source/drain regions 115p, 115n, and the patterned interlayer dielectric material 110. In certain embodiments, the deposition process 169 may be a highly conformal deposition process, such as, for example, an atomic layer deposition (ALD) process and the like, so that the protective liner layer 116 may have a substantially uniform thickness as previously described. For example, the thickness 116t of the protective liner layer may be in the range of approximately 2-5 nm depending on, among things, the material type and the specific deposition parameters, although it should be understood that other thicknesses may also be used. Furthermore, in at least some exemplary embodiments, the protective liner layer 116 may be any suitable dielectric insulation material, such as, for example, silicon nitride or silicon oxynitride and the like.

Figure 2B:
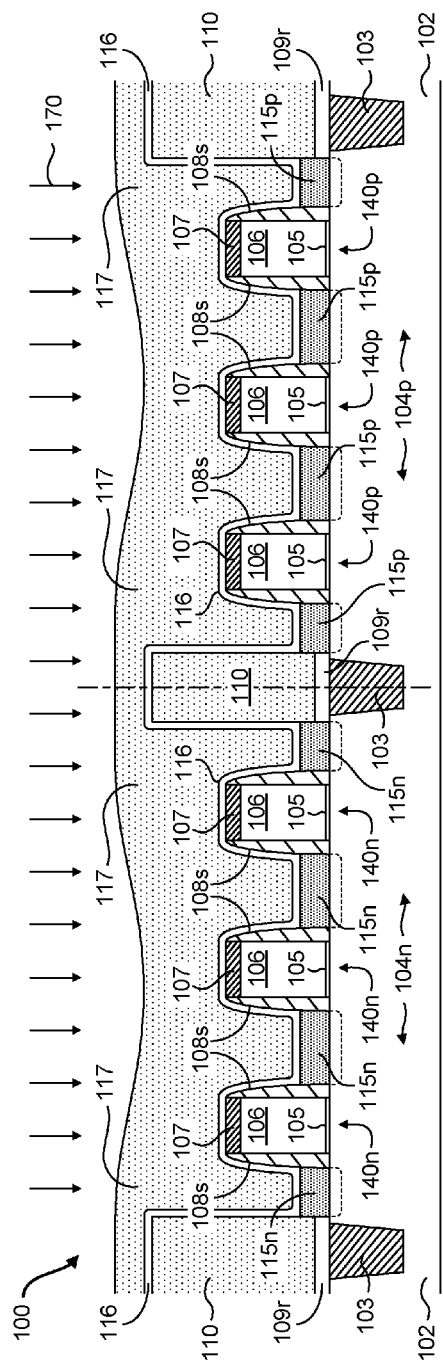

Turning now to FIG. 2B, a deposition process 170 may be performed so as to blanket deposit a second interlayer dielectric material 117 above the protective liner layer 116. As shown in FIG. 2B, the second interlayer dielectric material 117 may substantially completely fill the openings 110p, 110n in the first interlayer dielectric material 110, including the unfilled portions of the source/drain trenches 113, thereby completely covering the dummy gate structures 140p, 140n and the upper portions of the first interlayer dielectric material 110. In some embodiments, the deposition process 170 may be any suitable deposition process having a relatively high deposition rate and substantially good gap-fill characteristics, such as a chemical vapor deposition (CVD) process and the like. Furthermore, the second interlayer dielectric material 117 may be similar to, or substantially the same as, the first interlayer dielectric material 110. For example, in at least some embodiments, the second interlayer dielectric material 117 may be silicon dioxide, although other types of dielectric insulating material may also be used.

FIG. 2C schematically illustrates the device 100 of FIG. 2B during a further processing stage, wherein a planarization process 171, such as a chemical mechanical polishing (CMP) process and the like, may be performed so as to expose an upper surface 106u of the dummy gate electrode 106 of each of the dummy gate structures 140p and 140n. The planarization process 171 may be performed until the gate cap layers 207 have been removed from above each of the dummy gate structures 140p, 140n, thereby exposing the upper surfaces 106u. As shown in FIG. 2C, planarized portions 110r of the first interlayer dielectric material 110 positioned above the isolation regions 103 that laterally define the active regions 104p, 104n remain as part of the device 100, as do planarized portions 117r of the second interlayer dielectric material 117 positioned between and around the dummy gate structures 140p and 140n. Additionally, remaining portions 116r of the protective liner layer 116 substantially surround the remaining portions 117r of the second interlayer dielectric material 117.

With reference to FIG. 2D, after the planarization process 171 has been completed and the upper surfaces 106u of the dummy gate electrodes 106 have been exposed, one or more selective etching processes 172 may be performed so as to selectively remove at least the dummy gate electrodes 106 from between the sidewall spacers 108s so as to form a plurality of gate cavities 118. In some embodiments, the dummy gate insulation layers 105 may act as etch stop layers so as to protect the material of the active regions 104p, 104n below each of the respective dummy gate structures 140p, 140n, in which case at least a portion or even substantially all of the dummy gate insulation layers 105 may remain in the bottom of each gate cavity 113. In other embodiments, after the dummy gate electrodes 106 have been substantially removed, the selective etch chemistry of the etching process 172 may be adjusted so as to remove substantially all of the dummy gate insulation layers 105, thus exposing the upper surfaces 104u of the active regions 104p and 104n at the bottom of each gate cavity 113.

FIG. 2E schematically illustrates the device 100 of FIG. 2D after several steps of a replacement metal gate process have been performed so as to form a PMOS replacement high-k/metal gate (HK/MG) structures 150p in each of the respective gate cavities 113 above the PMOS active region 104p and to form NMOS replacement high-k/metal gate structures 150n in each of the respective gate cavities 113 above the NMOS active region 104n. As shown in FIG. 2E, in one exemplary embodiment, each of the PMOS replacement gate structures 150p may include a high-k gate insulation layer 151d, a plurality of metal layers 151a/b formed above the high-k gate insulation layer 151d, and a conductive gate electrode material 151g formed above the work function adjusting metal layers 151a/b. Furthermore, in other exemplary embodiments, each of the NMOS replacement gate structures 150n may include a high-k gate insulation layer 152d, at least one metal layer 152a formed above the high-k gate insulation layer 152d, and a conductive gate electrode material 152g formed above metal layer 152a. Additionally, a gate cap layer 153 may be formed above each of the respective PMOS and NMOS replacement gate structures 150p, 150n. Various methods for forming high-k/metal gate replacement gate structures are known in the art and will not be described herein.

The high-k gate insulation layers 151d and 152d may include one or more layers of suitable high-k dielectric material, wherein a high-k dielectric material may be understood to be one wherein the dielectric constant k is at least approximately 10 or greater. For example, and depending on the specific device conductivity type (e.g., N-type or P-type), suitable high-k dielectric materials may include tantalum oxide ($Ta_2O_5$), strontium titanate ($SrTiO_3$), hafnium oxide ($HfO_2$), zirconium oxide ($ZrO_2$), titanium oxide ($TiO_2$), aluminum oxide ($Al_2O_3$), yttrium oxide ($Y_2O_3$), lanthanum oxide ($La_2O_2$), hafnium silicates ($HfSiO_x$), hafnium silicon oxynitrides ($HfSiO_xN_y$), and the like. Furthermore, in those embodiments wherein the high-k gate insulation layers 151d, 152d may be made up of multiple material layers, one or more of the multiple layers may be a type of dielectric material other than a so-called "high-k" material, such as, for example, silicon dioxide and/or silicon oxynitride and the like.

The metal layers 151a/b and 152a may be any suitable metal material that may be adapted to adjust or control the work function of the finished transistor elements. For example, depending on the specific device type, suitable work function adjusting metal materials may include titanium nitride (TiN), titanium oxynitride (TiON), titanium oxycarbide (TiOC), titanium oxycarbonitride (TiOCN), titanium-aluminum (TiAl) tantalum silicon nitride (TiSiN), tantalum (Ta), tantalum nitride (TaN), tantalum carbide (TaC), tantalum carbonitride (TaCN), tantalum silicon nitride (TaSiN), tantalum silicide (TaSi), aluminum nitride (AlN), tungsten (W), molybdenum (Mo), hafnium nitride (HfN), hafnium silicide (HfSi), titanium (Ti), aluminum (Al), platinum (Pt), rubidium (Ru), iridium (Ir) and the like. Additionally, as with the high-k gate insulation layers 151d, 152d described above, any one or more of the metal layers 151a/b, 152a may be a single material layer, or alternatively may include a plurality of different work function adjusting metal material layers, depending on the overall device design and operating parameters.

It should be understood by those of ordinary skill in the art after a complete reading of the present disclosure that the number and relative positioning of the HK/MG material layers specifically depicted for the PMOS and NMOS replacement gate structures 150p, 150n in FIG. 2E are exemplary only, as other configurations may also be employed depending on the design parameters and/or conductivity type of the given device.

Figure 2S:
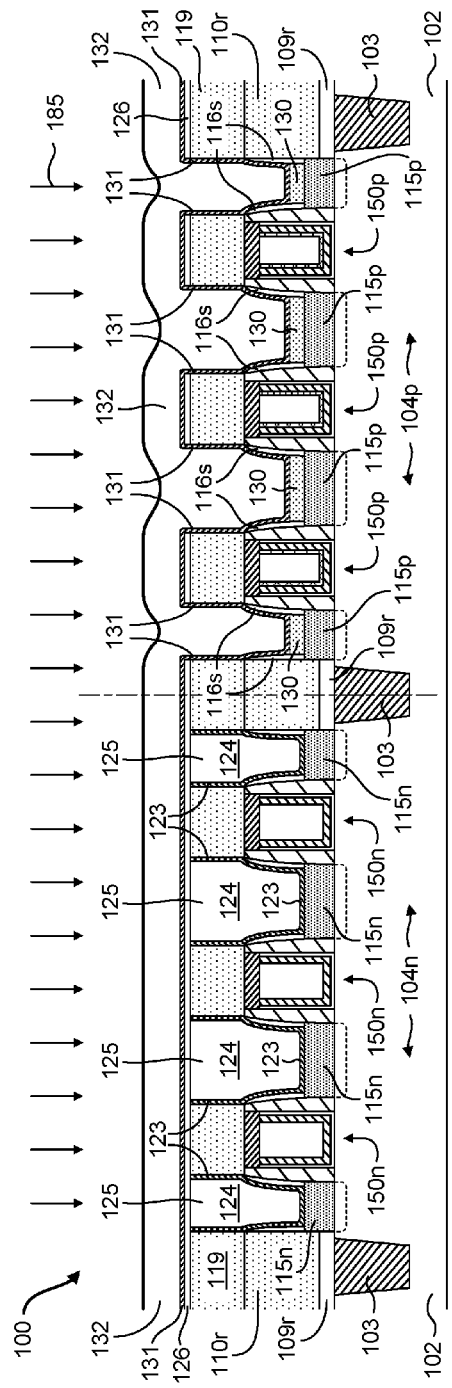
Figure 2T:
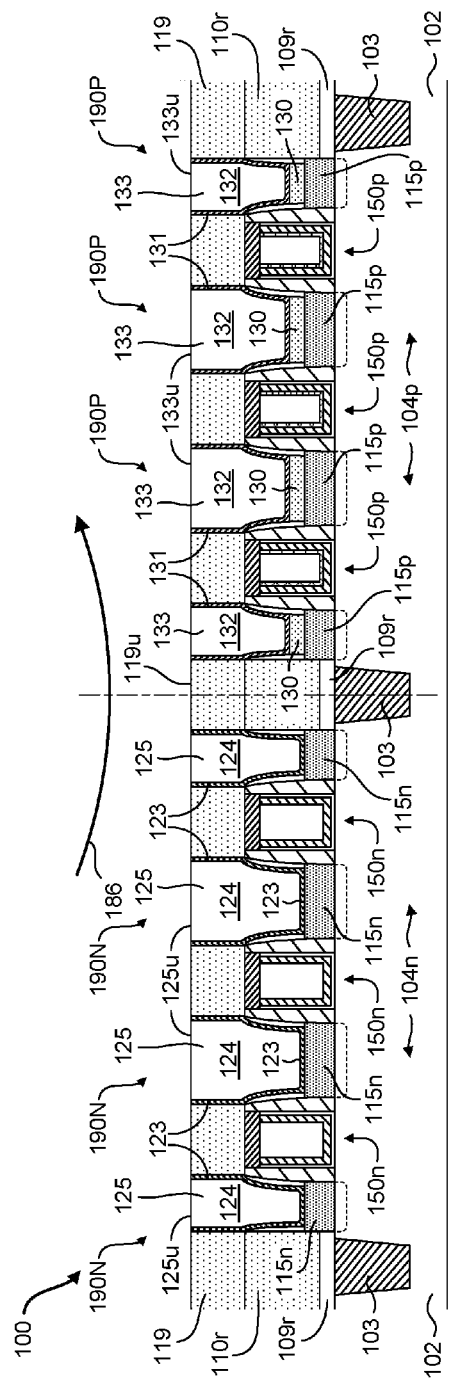

FIGS. 2F-2T are schematic cross-sectional views of the device 100 that depict various exemplary processing steps that may be used for forming contact elements to the confined raised source/drain regions 115p, 115n after the replacement metal gate (RMG) process has been performed and the PMOS and NMOS replacement gate structures 150p, 150n have been formed above the respective PMOS and NMOS active regions 104p, 104n. Turning first to FIG. 2F, a further exemplary processing stage of the device 100 is schematically illustrated wherein a deposition process 173 may be performed so as to blanket deposit a third interlayer dielectric material 119 above the device 100 so as to substantially completely cover the PMOS and NMOS replacement gate structures 150p, 150n. The deposition process 173 may be any suitable deposition process having a relatively high deposition rate, such as a chemical vapor deposition (CVD) process and the like. In at least some embodiments, the third interlayer dielectric material 117 may be the same as the first and second interlayer dielectric materials 110 and 117, e.g., silicon dioxide, although other types of dielectric insulating material may also be used. In certain embodiments, and depending on the as-deposited planarity of the third interlayer dielectric material 119, a planarization process 174, such as a CMP process and the like, may be performed so as to provide the third ILD material 119 with a substantially planar upper surface 119u in preparation for subsequently performing a photolithographic patterning process on the device 100, as will be further described below.

Turning now to FIG. 2G, a further processing stage of the device 100 is schematically illustrated wherein a patterned etch mask 120, such as a photoresist mask and the like, has been formed above the third interlayer dielectric material 119. As shown in FIG. 2G, the patterned etch mask 120 may completely cover the PMOS active region 104p and the PMOS replacement gate structures 150p formed thereabove. Furthermore, the patterned etch mask 120 may include a plurality of openings 121, each of which may be positioned above and substantially vertically aligned with a respective one of the confined raised source/drain regions 115n that were previously formed above the NMOS active region 104n during an earlier processing stage (see, FIG. 1J). Thereafter, as shown in FIG. 2H, an etching process 175 may be performed through the openings 121 in the patterned etch mask 120 to thereby form contact openings 122 that extend through the third interlayer dielectric material 119 and the second interlayer dielectric material 117, as well as through the substantially horizontally oriented portions of the remaining protective liner portions 116r covering the raised source/drain regions 115n, thus exposing an upper surface 115u of each region 115n.

In some exemplary embodiments, the etching process 175 may be a substantially anisotropic (directional) etching process, such as a dry reactive ion etching (RIE) process and the like. Due to the substantially directional etching characteristics of the etching process 175, the substantially horizontally oriented portions of the remaining protective liner layer portions 116r present above the NMOS active region 104n will be etched away to expose the upper surfaces 115u of the confined raised source/drain regions 115n. However, the substantially vertically oriented portions of the remaining protective liner layer portions 116r may only be minimally affected by the etching process 175, e.g., resulting in only a slightly reduced thickness of the vertical layer portions 116r. Therefore, in at least some illustrative embodiments, protective spacers 116s may be formed from the remaining protective liner layer portions 116r during the etching process 175. Furthermore, the presence of the protective spacers 116s may prevent, or at least substantially minimize, any reduction in the thickness of the sidewall spacers 108s during the etching process 175, thus minimizing parasitic capacitance.

FIG. 2I schematically depicts the device 100 of FIG. 2H in a later processing stage, wherein a mask removal process 176 may be performed to remove the patterned etch mask 120 from above the third interlayer dielectric material 119 after it has been patterned as described above. In those embodiments wherein the patterned etch mask 120 may be a photoresist mask, the mask removal process 176 may be, for example, an ashing process and the like. Thereafter, a deposition process 177 may be performed as shown in FIG. 2J to deposit a substantially conformal barrier layer 123 above the device 100 so as to line at least the inside surfaces of the contact openings 122 and cover the upper surfaces 115u of the confined raised source/drain regions 115n between and around the NMOS replacement gate structures 150n. As shown in FIG. 2J, a portion of the barrier layer 123 may also be formed above the upper surface 119u of the third interlayer dielectric material 119.

In certain embodiments, the deposition process 177 may be any suitable conformal deposition process known in the art, such as, for example, an atomic layer deposition (ALD) process or a plasma-enhanced chemical vapor deposition (PECVD) process and the like. Depending on the specific device design and processing criteria, the thickness 123t of the barrier layer 123 may be in the range of about 1-3 nm, and may be substantially uniform over horizontal, vertical and/or angled surfaces of the device 100, within normally accepted processing variations and tolerances. Furthermore, in at least some embodiments, the barrier layer 123 may be made up of a plurality of sub-layers (not shown), wherein each sub-layer may be substantially conformal and have a substantially uniform sub-layer thickness. Moreover, each sub-layer may be a different material type, depending on the particular desired characteristics of the barrier layer 123.

As noted previously, when the etching process 175 that is used to form the contact openings 122 is a dry reactive ion etching (ME) process, damage to the upper surfaces 115u of the confined raised source/drain regions 115n can sometimes occur. See, FIGS. 2H and 21. However, for NMOS type devices, such as the NMOS transistor devices 190N shown in FIGS. 2H and 21, such RIE damage does not generally have a significant effect on the Schottky barrier height at the metal/semiconductor interface, which is typically lower for NMOS contact elements. As such, the effects of any such RIE damage that may occur to the upper surfaces 115u of the confined raised source/drain regions 115n of the NMOS transistor devices 190N may be reduced or substantially minimized by depositing an appropriate n-type metal over the damaged areas, thus substantially preserving the ohmic characteristics of the subsequently formed contact elements 125 (see, FIG. 2L). Therefore, in certain exemplary embodiments disclosed herein, the material of the barrier layer 123 may comprise any one or more suitable n-type metals, such as, for example, titanium (Ti) and/or titanium nitride (TiN). Other suitable n-type metals that may be used to form the barrier layer 123 so as to minimize the potential adverse effects of any RIE damage to the upper surface 115u of the confined raised source/drain regions 115n include erbium (Er), ytterbium (Yb), lanthanum (La), scandium (Sc), hafnium (Hf), and zirconium (Zr).

Turning now to FIG. 2K, the semiconductor device 100 shown in FIG. 2J is schematically depicted during a further illustrative processing stage, wherein a deposition process 178 is being performed so as to form a layer of conductive contact material 124 above the device 100. In certain embodiments, the layer of conductive contact material 124 may be blanket deposited above the device 100 so as to cover the barrier layer 123 and substantially completely fill the remaining portions of the contact openings 122 above each of the confined raised source/drain regions 115n. Additionally, excess portions of the conductive contact material 124 may be formed outside of the contact openings 122 and above the third interlayer dielectric material 119, as shown in FIG. 2K.

In some embodiments, the deposition process 178 may be any suitable deposition process having substantially good gap-fill characteristics, such as, for example, a chemical vapor deposition (CVD) process and the like. Furthermore, the material composition of the conductive contact material may be any type of conductive material that is generally suitable for use in forming contacts to the contact regions positioned in the device level of the device 100. For example, in some embodiments, the conductive contact material 124 may be tungsten or a suitable tungsten alloy material, although other suitable conductive materials may also be used.

FIG. 2L schematically illustrates a further processing stage of the device 100 depicted in FIG. 2K. As shown in FIG. 2L a planarization process 179, such as a chemical mechanical polishing (CMP) process and the like, may be performed to remove any excess portions of conductive contact material 124 and barrier layer 123 that are formed outside of the contact openings 122, thus exposing and re-planarizing the upper surfaces 119$u$ of the third interlayer dielectric material 119. Upon completion of the planarization process 179, a plurality of contact elements 125 are formed that are embedded in the interlayer dielectric materials 119, 110 and extend down to the confined raised source/drain regions 115$n$ of the various NMOS transistor elements 190N. As shown in FIG. 2L, each of the contact elements 125 may be made up of a core of conductive contact material 124 and a barrier layer 123 that is positioned between the core and the surrounding interlayer dielectric materials 119, 110 and/or the NMOS replacement gate structures 150$n$. In at least some embodiments, the planarized upper surfaces 125$u$ of the contact elements 125 may be substantially co-planar with the planarized upper surfaces 119$u$ of the third interlayer dielectric material 119, although in other embodiments the upper surfaces 125$u$ may be either slightly recessed or slightly raised relative to the upper surfaces 119$u$, depending on the type and efficiency of the planarization process 179.

After forming the contact elements 125, an optional deposition process 180 may be performed so as to form an optional hard mask layer 126 above both the PMOS and NMOS active regions 104$p$, 104$n$, so as to completely cover the upper surfaces 119$u$ of the third interlayer dielectric material 119 and the upper surfaces 125$u$ of the contact elements 125, as shown in FIG. 2M. In certain embodiments, the optional hard mask layer 126 may be a deposition mask that is adapted to cover and protect the upper surfaces 125$u$ of the contact elements 125 so as to prevent epitaxial semiconductor material from being formed on the upper surfaces 125$u$ during a second epitaxial growth process 183 that may be used to form additional semiconductor material layers 130 above the confined raised source/drain regions 115$p$ formed above the PMOS active region 104$p$, as will be further described in conjunction with FIG. 2Q below. The optional hard mask layer 126 may be any known and suitable deposition mask material, e.g., a dielectric material such as silicon nitride, silicon dioxide and/or silicon oxynitride and the like. Furthermore, the thickness 126$t$ of the optional hard mask layer 126 may be as required to provide the desired degree of protection to the contact elements 125 during the second epitaxial growth process 183.

Referring to FIG. 2N, a further processing stage of the device 100 shown in FIG. 2M is schematically illustrated wherein a patterned etch mask 127, such as a photoresist mask and the like, has been formed above the third interlayer dielectric material 119 (and the optional hard mask layer 126, when used). As shown in FIG. 2N, the patterned etch mask 127 may completely cover the NMOS active region 104$n$ and the contact elements 125 formed thereabove. Furthermore, the patterned etch mask 127 may include a plurality of openings 128, each of which may be positioned above and substantially vertically aligned with a respective one of the confined raised source/drain regions 115$p$ that were previously formed above the PMOS active region 104$p$ during an earlier processing stage (see, FIG. 1J). Thereafter, as shown in FIG. 2O, an etching process 181 may be performed through the openings 128 in the patterned etch mask 127 to thereby form contact openings 129 that extend through the third interlayer dielectric material 119 (and the optional hard mask layer 126, when used), the second interlayer dielectric material 117$r$, and the substantially horizontally oriented portions of the remaining protective liner portions 116$r$ covering the raised source/drain regions 115$p$, thus exposing an upper surface 115$u$ of each region 115$p$.

In some exemplary embodiments, the etching process 181 may be a substantially anisotropic (directional) etching process, such as a dry reactive ion etching (RIE) process and the like. Due to the substantially directional etching characteristics of the etching process 181, the substantially horizontally oriented portions of the remaining protective liner layer portions 116$r$ present above the PMOS active region 104$p$ will be etched away to expose the upper surfaces 115$u$ of the confined raised source/drain regions 115$p$. However, the substantially vertically oriented portions of the remaining protective liner layer portions 116$r$ may only be minimally affected by the etching process 181, e.g., resulting in only a slightly reduced thickness of the vertical layer portions 116$r$. Therefore, in at least some illustrative embodiments, protective spacers 116$s$ may be formed from the remaining protective liner layer portions 116$r$ during the etching process 181. Furthermore, the presence of the protective spacers 116$s$ may prevent, or at least substantially minimize, any reduction in the thickness of the sidewall spacers 108$s$ during the etching process 181, thus minimizing parasitic capacitance.

FIG. 2P schematically depicts the device 100 of FIG. 2O in a later processing stage, wherein a mask removal process 182 may be performed to remove the patterned etch mask 127 from above the third interlayer dielectric material 119 (and the optional hard mask layer 126, when used) after it has been patterned as described above. In those embodiments wherein the patterned etch mask 127 may be a photoresist mask, the mask removal process 182 may be, for example, an ashing process and the like.

Turning now to FIG. 2Q, after completion of the mask removal process 182, a second epitaxial growth process 183 may then be performed so as to epitaxially grow a further semiconductor material layer 130 on each of the upper surfaces 115$u$ of the confined raised source/drain regions 115$p$ during the first epitaxial growth process 168 (see, FIG. 1J). As shown in FIG. 2Q, each of the semiconductor material layers 130 may be substantially confined between the protective spacers 116$s$ covering the sidewall spacers 108$s$ of adjacent PMOS replacement gate structures 150$p$, as well as between the protective spacers 116$s$ covering the sidewalls of the first interlayer dielectric material 110 on one side and the protective spacers 116$s$ covering the sidewall spacer 108$s$ of an adjacent PMOS replacement gate structure 150$p$ on another side. In certain embodiments, the thickness 130$t$ of each of the semiconductor material layers 130 may be in the range of approximately 10-20 nm. However, other thicknesses may also be used depending on the device design requirements and/or any other specific device processing considerations, such as etching damage to the upper surfaces 115$u$ of the confined raised source drain regions 115$p$, as will be further discussed below.

In some illustrative embodiments, the layer of semiconductor material 130 may be a substantially pure germanium material that is in situ doped with an appropriate p-type dopant, such as boron (B) and the like, during the epitaxial growth process 183. In other embodiments, the semiconductor material layer 130 may be a silicon-germanium alloy that is an in situ doped during the epitaxial growth process 183, e.g., with boron. Depending on the specific device design requirements, the silicon-germanium used to form the semiconductor material layers 130 may have a germanium concentration of at least approximately 30 atomic percent, although higher or lower germanium concentrations may also be used.

As with the confined raised source/drain regions 115n formed above the NMOS active region 104n, when the etching process 181 that is used to form the contact openings 129 is a dry reactive ion etching (ME) process, some amount of ME-related damage to the upper surfaces 115u of the confined raised source/drain regions 115p can also occur. See, FIGS. 2O and 2P. However, unlike the situation with the NMOS transistor devices 190N described with respect to FIGS. 2H-2J above, such ME damage may have a substantially significant effect on the Schottky barrier height at the metal/semiconductor interface of contact elements to the PMOS transistor devices 190P, which is inherently higher than would typically be the case for contact elements to NMOS devices. As such, the layers of semiconductor material 130 are adapted to "repair" the ME damage to the upper surface 115u of the confined raised source/drain regions 115p formed above the PMOS device region 104p by providing a substantially undamaged metal/semiconductor contact interface at the upper surfaces 130u of the semiconductor material layers 130. Additionally, since both the etching process 181 and the mask removal process 182 are performed prior to the epitaxial growth process 183, the upper surfaces 130u of the semiconductor material layers 130 will also be substantially clean, as there will be substantially no nitride residues from the protective liner layer portions 116r or polymer residues from the patterned photoresist etch mask 127 present on the upper surfaces 130u. Therefore, due to the substantially clean and undamaged upper surfaces 130u, a higher quality metal/semiconductor contact interface may be provided. As such, the Fermi level of any metals that make up the subsequently formed contact elements 133 (see, FIGS. 2R-2T) will be pinned to the valence band of the semiconductor material 130, e.g., boron doped germanium or boron doped silicon-germanium. Consequently, a low Schottky barrier height may thus result at the metal/semiconductor interface, thus substantially preserving the ohmic characteristics of the PMOS device contacts 133.

FIG. 2R schematically depicts the device 100 of FIG. 2Q during a further device processing stage, wherein a deposition process 184 may be performed to deposit a substantially conformal barrier layer 131 above the device 100. As shown in FIG. 2R, the conformal barrier layer may be formed so as to line at least the inside surfaces of the contact openings 129 and cover the upper surfaces 130u of the semiconductor material layers 130 formed above the PMOS active region 104p between and around the PMOS replacement gate structures 150p. Additionally, a portion of the barrier layer 131 may also be formed above the upper surface 119u of the third interlayer dielectric material 119 (and above the upper surface 126u of the optional hard mask layer 126, when used).

In certain embodiments, the deposition process 184 may be any suitable conformal deposition process known in the art, such as, for example, an atomic layer deposition (ALD) process or a plasma-enhanced chemical vapor deposition (PECVD) process and the like. Depending on the specific device design and processing criteria, the thickness 131t of the barrier layer 131 may be in the range about 1-3 nm, and may be substantially uniform as previously described with respect to the barrier layer 123. Furthermore, in at least some embodiments, the barrier layer 131 may be made up of a plurality of sub-layers (not shown), wherein each sub-layer may be substantially conformal and have a substantially uniform sub-layer thickness. Moreover, each sub-layer may be a different material type, depending on the particular desired characteristics of the barrier layer 131.

In some exemplary embodiments disclosed herein, the material of the barrier layer 131 may comprise any one or more suitable p-type metals so that the Fermi level of the metal may be appropriately pinned to the valence band of the underlying semiconductor material layers 130, thus providing a low Schottky barrier height as previously described. For example, in certain embodiments, the material of the barrier layer 131 may include p-type metals such as gold (Au), nickel (Ni) and/or platinum (Pt) and the like, although other suitable p-type metals may also be used. In still other illustrative embodiments, the barrier layer 131 may also include titanium (Ti) and/or titanium nitride (TiN).

Turning now to FIG. 2S, the semiconductor device 100 of FIG. 2R is schematically illustrated during a further exemplary processing stage, wherein a deposition process 185 may be performed so as to blanket deposit a layer of conductive contact material 132 above the device 100. In certain embodiments, the layer of conductive contact material 132 may be formed so as to cover the barrier layer 131 and substantially completely fill the remaining portions of the contact openings 129 above each of the semiconductor material layers 130. Additionally, excess portions of the conductive contact material 132 may be formed outside of the contact openings 129 and above the third interlayer dielectric material 119 (and the optional hard mask layer 126, when used), as shown in FIG. 2S.

In some embodiments, the deposition process 185 may be any suitable deposition process having substantially good gap-fill characteristics, e.g., a chemical vapor deposition (CVD) process and the like. Furthermore, the material composition of the conductive contact material may be any type of conductive material that is generally suitable for use in forming contacts to the contact regions positioned in the device level of the device 100. For example, in some embodiments, the conductive contact material 132 may be the same type of material that is used to form the conductive contact material 124 in the contact openings 122 above the NMOS active region 104n (see, FIG. 2K), such as tungsten or a suitable tungsten alloy material, although other suitable conductive materials may also be used.

FIG. 2T schematically depicts a further device processing stage of the semiconductor device 100 shown FIG. 2S. As shown in FIG. 2T, a planarization process 186, such as a chemical mechanical polishing (CMP) process and the like, may be performed to remove any excess portions of conductive contact material 132 and barrier layer 131 that are formed outside of the contact openings 129. Additionally, in those embodiments wherein an optional hard mask layer 126 is formed above the device 100 prior to forming the contact openings 129, the optional hard mask layer 126 may also be removed from above the third interlayer dielectric material 119, thus exposing and re-planarizing the upper surfaces 119u of the third interlayer dielectric material 119 and the upper surfaces 133u of the contact elements 133.

Upon completion of the planarization process 186, a plurality of contact elements 133 are formed that are embedded in the interlayer dielectric materials 119, 110 and extend down to the semiconductor material layers 130 that are formed above the confined raised source/drain regions 115p of the various PMOS transistor elements 190P. As shown in FIG. 2T, each of the contact elements 133 may be made up of a core of conductive contact material 132 and a barrier layer 131 that is positioned between the core and the surrounding interlayer dielectric materials 119, 110 and/or the PMOS replacement gate structures 150p. In at least some embodiments, the planarized upper surfaces 133u of the contact elements 133 may be substantially co-planar with the re-planarized upper surfaces 119u of the third interlayer dielectric material 119, although in other embodiments the upper surfaces 133u may be either slightly recessed or slightly raised relative to the upper surfaces 119u, depending on the type and efficiency of the planarization process 186.

After completion of the semiconductor device structure 100 depicted in FIG. 2T, further back-end-of-line (BEOL) processing steps may be performed so as to form a metallization system, including one or more metallization layers, above the third interlayer dielectric material 119 and electrically connecting to the NMOS contact elements 125 and the PMOS contact elements 133.

While the various steps illustrated in FIGS. 2F-2T and described above outline a processing sequence wherein the contact elements 125 are formed to the NMOS transistor devices 190N before the contact elements 133 are formed to the PMOS transistor elements 190P, it should be understood by those of ordinary skill in the art after a complete reading of the present disclosure that the contact elements 133 may readily be formed prior to the contact elements 125 with substantially no impact on the finished device 100. For example, the sequence of processing steps shown in FIGS. 2N-2T may be performed immediately after the third interlayer dielectric material 119 is formed as shown in FIG. 2F, thus forming the semiconductor layers 130 and the contact elements 133. Thereafter, the sequence of processing steps shown in FIGS. 2G-2L may be performed so as to form the contact elements 125. Furthermore, it should also be understood that the optional deposition hard mask layer 126 shown in FIG. 2M may not be required, since the epitaxial growth process 183 that is used to form the semiconductor material layers 130 would be performed before the contact elements 125 are formed and while the NMOS device region 104n remains covered by the third interlayer dielectric material 119.

FIGS. 3A-3I are schematic cross-sectional views of an alternative processing sequence that may be used to perform confined epitaxial growth techniques to form raised source/drain regions prior to forming replacement high-k/metal gate structures that is different than the sequence depicted in FIGS. 1B-1J and described above. In particular, the alternative processing sequence illustrated in FIGS. 3A-3I is substantially similar in many respects to the sequence depicted in FIGS. 1B-1J, wherein, however, the sidewall spacers 108s are formed in the alternative processing sequence of FIGS. 3A-3I after the etch stop layer 109 has been formed, whereas the sidewall spacers 108s are formed in the processing sequence of FIGS. 1B-1J before the etch stop layer 109 has been formed. Accordingly, while the same element reference numbers included in FIGS. 1B-1J above are used to illustrate many similar elements and steps in FIGS. 3A-3I, the following description of the alternative processing sequence shown in FIGS. 3A-3I does not include the same level of detail as that set forth above with respect to FIGS. 1B-1J. However, it should be understood that unless otherwise specifically noted herein, the pertinent descriptive aspects of the processing sequence illustrated in FIGS. 1B-1J apply equally as well to the various similarly numbered elements and steps of the alternative sequence depicted in FIGS. 3A-3I, even though such aspects may not be fully described herein.

Figure 3A:
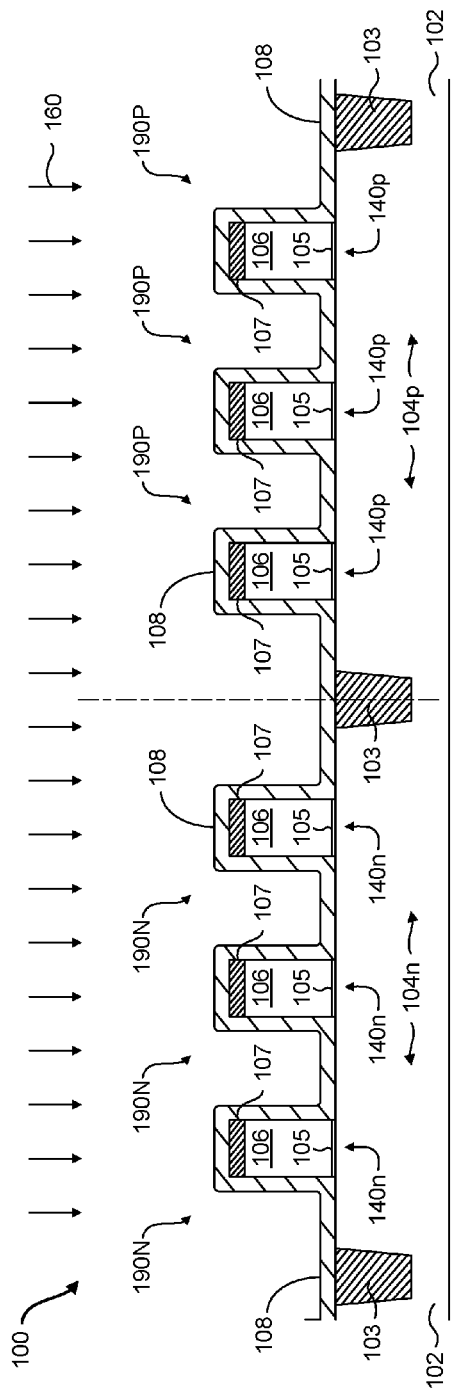
Figure 3B:
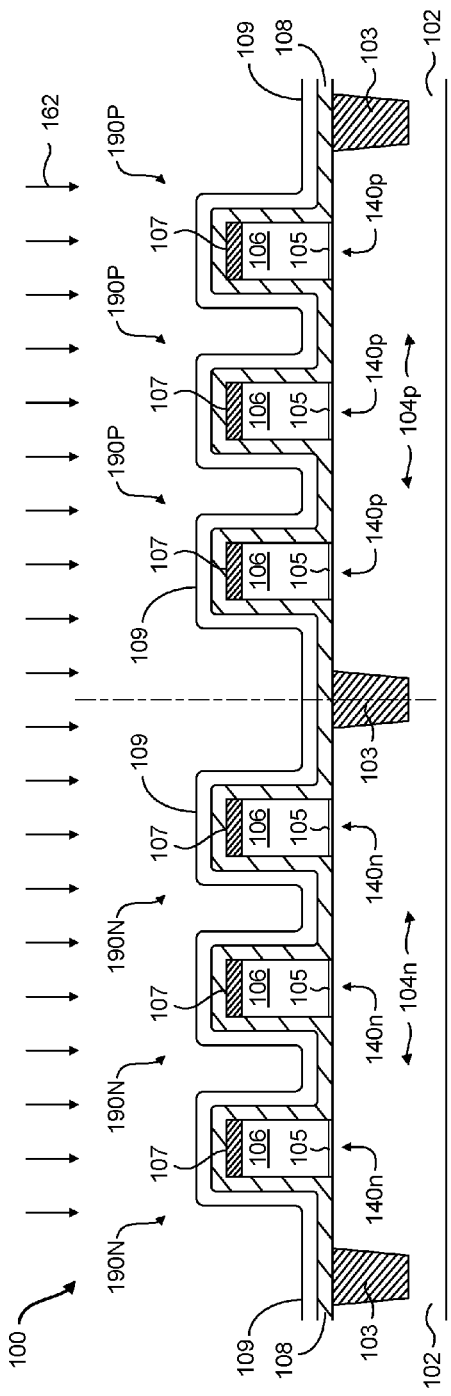

Turning first to FIG. 3A, the alternative processing sequence may begin in similar fashion to the step depicted in FIG. 1B above, that is, by performing the previously described deposition process 160 so as to form the substantially conformal layer of spacer material 108 above the plurality of dummy gate structures 140p and 140n shown in FIG. 1A. Thereafter, as shown in FIG. 3B, the deposition process 162 may be performed so as to form the etch stop layer 109 above all exposed surfaces of the layer of spacer material 108. Turning now to FIG. 3C, the first interlayer dielectric material 110 may then be formed above the etch stop layer 109, after which the planarization process 164 may be performed on the first interlayer dielectric layer 110 so as to provide a substantially planar upper surface 110u.

Referring to FIG. 3D, the patterned etch mask 111 may then be formed above the planarized upper surface 110u of the first interlayer dielectric material 110. As previously noted with respect to FIG. 1F, the mask openings 112p and 112n may be positioned substantially directly above the respective pluralities of dummy gate structures 140p and 140n, and sized so as to facilitate the exposure of the upper surfaces 104u of the respective active regions 104p and 104n. Thereafter, the etching process 165 may then be performed through the mask openings 112p and 112n so as to form the openings 110p and 110n in the first interlayer dielectric material 110 above the respective device active regions 104p and 104n while using the etch stop layer 109 as an etch stop, as shown in FIG. 3E. Next, as shown in FIG. 3F, the mask removal process 166, e.g., an ashing process and the like, may be performed so as to remove the patterned mask layer 111 from above the first interlayer dielectric material 110.

Turning now to the processing stage depicted in FIG. 3G, the selective etch process 167 is then performed so as to remove the exposed portions of the etch stop layer 109 from above the layer of spacer material 108. As with the processing sequence depicted in FIGS. 1B-1J, a portion 109r of the etch stop layer 109 remains in place between first interlayer dielectric material 110 and the areas of the substrate 102 that remain covered by first ILD material 110. However, since the etch stop layer 109 was formed above the layer of spacer material 108 during the present alternative processing sequence before the sidewall spacers 108s have been formed (cf., FIG. 1C above), the layer of spacer material 108 also extends between the remaining portions 109r of the etch stop layer 109 and the substrate 102.

FIG. 3H schematically depicts the device of FIG. 3G during a subsequent stage of the alternative processing sequence, wherein the substantially directional anisotropic etch process 161 may be performed so as to remove the substantially horizontally oriented portions of the layer of spacer material 108, thereby forming the sidewall spacers 108s adjacent to the sidewalls of each of the dummy gate structures 140p and 140n. Furthermore, at this processing stage, the plurality of source/drain trench contact openings 113 that expose the upper surfaces 104u of the active regions 104p, 104n are now positioned between the sidewall spacers 108s of adjacent dummy gate structures 140p, 140n, as well as between the sidewalls of the openings 110p, 110n and the sidewall spacers 108s of the dummy gate structures 140p, 140n adjacent thereto. Additionally, in some exemplary embodiments, after the sidewall spacers 108s have been formed and the source/drain trench openings 113 defined, the previously described optional hot wet ammonia etching process (not shown) may be performed so as to form the recesses 114 (indicated by dashed lines in FIG. 3H) in the active regions 104p, 104n below the trench openings 113.

Figure 3I:
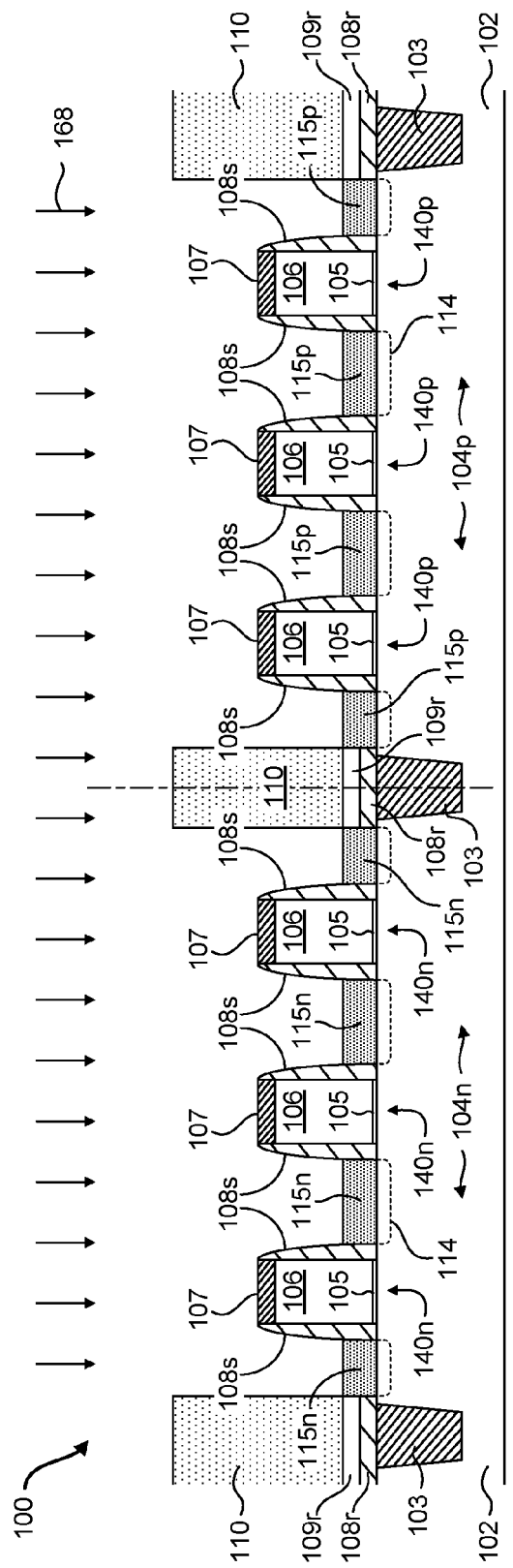

Referring now to the subsequent stage of the alternative processing sequence depicted in FIG. 3I, the first epitaxial growth process 168 may now be performed so as to epitaxially grow a semiconductor material on the upper surfaces 104u of the active regions 104p, 104n (or in and above the optional recesses 114, when provided), thereby forming the confined raised source/drain regions 115p, 115n in the bottoms of the respective source/drain trenches 113 formed above the active region 104p and the active region 104n. As with the processing sequence shown in FIGS. 1B-1J, since the replacement metal gate (RMG) process has not yet been performed, the first epitaxial growth process 168 may again be performed with a higher thermal budget. Thereafter, further processing of the semiconductor device 100 may continue substantially as is depicted in FIGS. 2A-2T and described above.

The particular embodiments disclosed above are illustrative only, as the invention may be modified and practiced in different but equivalent manners apparent to those skilled in the art having the benefit of the teachings herein. For example, the method steps set forth above may be performed in a different order. Furthermore, no limitations are intended by the details of construction or design herein shown. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   an isolation region laterally defining an active region in a semiconductor substrate;
   a gate structure positioned above said active region;
   a sidewall spacer positioned adjacent to sidewalls of said gate structure;
   an etch stop layer positioned above and covering a portion of said active region;
   an interlayer dielectric material positioned above said active region and covering said etch stop layer;
   a confined raised source/drain region positioned on and in contact with an upper surface of said active region, wherein said confined raised source/drain region extends laterally between and contacts a lower sidewall surface portion of said sidewall spacer and at least a portion of a sidewall surface of said etch stop layer; and
   a conductive contact element extending through said interlayer dielectric material and directly contacting an upper surface of said confined raised source/drain region.

2. The semiconductor device of claim 1, wherein said gate structure is a replacement gate structure that comprises a gate insulation layer comprising a high-k dielectric material and at least one metal layer comprising a work function adjusting material.

3. The semiconductor device of claim 1, wherein said etch stop layer comprises a high-k dielectric material.

4. The semiconductor device of claim 1, further comprising a liner layer positioned between said etch stop layer and said upper surface of said active region, said liner layer comprising a same material as said sidewall spacer, wherein said confined raised source/drain region contacts a sidewall surface of said liner layer.

5. The semiconductor device of claim 1, wherein said confined raised source/drain region contacts a lower sidewall surface portion of said interlayer dielectric material positioned above and covering said etch stop layer.

6. The semiconductor device of claim 1, wherein said sidewall spacer is a first sidewall spacer, the semiconductor device further comprising a second sidewall spacer positioned above and covering a portion of said upper surface of said confined raised source/drain region, said second sidewall spacer covering an upper sidewall surface portion of said first sidewall spacer and an upper sidewall surface portion of said interlayer dielectric material.

7. The semiconductor device of claim 1, wherein said active region comprises a first semiconductor material and said confined raised source/drain region comprises a second semiconductor material that is different from said first semiconductor material.

8. The semiconductor device of claim 1, wherein said interlayer dielectric material is a first interlayer dielectric material, the semiconductor device further comprising a second layer of interlayer dielectric material positioned above said first interlayer dielectric material, said conductive contact element extending continuously through said first and second interlayer dielectric materials.

9. The semiconductor device of claim 1, wherein said confined raised source/drain region comprises a first layer of a first semiconductor material and a second layer of a second semiconductor material positioned above said first layer.

10. The semiconductor device of claim 9, wherein said first semiconductor material is silicon and said second semiconductor material is one of germanium and silicon-germanium.

11. The semiconductor device of claim 9, wherein said sidewall spacer is a first sidewall spacer, the semiconductor device further comprising a second sidewall spacer positioned above and covering a portion of an upper surface of said first layer of said confined raised source/drain region, said second sidewall spacer covering an upper sidewall surface portion of said first sidewall spacer and an upper sidewall surface portion of said interlayer dielectric material, wherein said second layer of said confined raised source/drain region extends laterally between and contacts lower sidewall surface portions of said second sidewall spacer, said conductive contact element directly contacting an upper surface of said second layer of said confined raised source/drain region.

12. The semiconductor device of claim 1, wherein said gate structure is a first gate structure, said sidewall spacer is a first sidewall spacer positioned on at least first and second sides of said first gate structure, said confined raised source/drain region is a first confined raised source/drain region that contacts a lower sidewall surface portion of said first sidewall spacer on said first side of said first gate structure, and said conductive contact element is a first conductive contact element, the semiconductor device further comprising:
   a second gate structure positioned above said active region,
   a second sidewall spacer positioned adjacent to sidewalls of said second gate structure, wherein said second sidewall spacer is positioned on at least first and second sides of said second gate structure;
   a second confined raised source/drain region positioned on and in contact with an upper surface of said active region, wherein said second confined raised source/ drain region extends laterally between and contacts a lower sidewall surface portion of said first sidewall spacer on said second side of said first gate structure and a lower sidewall surface portion of said second sidewall spacer positioned on said first side of said second gate structure; and a second conductive contact element extending through said interlayer dielectric material and directly contacting an upper surface of said second confined raised source/drain region.

13. The semiconductor device of claim 1, wherein said active region is a first active region, said gate structure is a first gate structure, said sidewall spacer is a first sidewall spacer, said confined raised source/drain region is a first confined raised source/drain region, and said conductive contact element is a first conductive contact element, the semiconductor device further comprising:

a second gate structure positioned above a second active region that is laterally defined by said isolation region in said semiconductor substrate, wherein a portion of said etch stop layer is positioned above and covers a portion of said second active region and said interlayer dielectric material is positioned above said second active region and covers said portion of said etch stop layer;

a second sidewall spacer positioned adjacent to sidewalls of said second gate structure;

a second confined raised source/drain region positioned on and in contact with an upper surface of said second active region, wherein said second confined raised source/drain region comprises:

a first semiconductor layer portion that extends laterally between and contacts a lower sidewall surface portion of said second sidewall spacer and at least a portion of a sidewall surface of said portion of said etch stop layer; and a second semiconductor layer portion positioned on an upper surface of said first semiconductor layer portion, said second semiconductor layer portion being a different semiconductor material than said first semiconductor layer portion, wherein a height level of an upper surface of said second semiconductor layer portion above said upper surface of said second active region is greater than a height level of said upper surface of said first confined raised source/drain region above said upper surface of said first active region; and a second conductive contact element extending through said interlayer dielectric material and directly contacting said upper surface of said second semiconductor layer portion of said second confined raised source/drain region.

14. A semiconductor device, comprising:

a plurality of first gate structures and a plurality of second gate structures positioned above respective first and second active regions of a semiconductor substrate;

a plurality of first raised source/drain regions and a plurality of second raised source/drain regions positioned adjacent to and between each of said respective pluralities of first and second gate structures, each of said first and second raised source/drain regions comprising a first semiconductor material, wherein at least a first one of each of said pluralities of first and second raised source/drain regions is laterally confined between and in direct contact with sidewall spacers positioned adjacent to each of said respective pluralities of first and second gate structures;

a layer of a second semiconductor material positioned on an upper surface of each of said plurality of second raised source/drain regions, wherein a height level of an upper surface of said layer of said second semiconductor material above an upper surface of said second active region is greater than a height level of an upper surface of said first raised source/drain region above an upper surface of said first active region;

a first contact element directly contacting said upper surface of a respective one of said plurality of first raised source/drain regions; and a second contact element directly contacting said upper surface of said layer of said second semiconductor material positioned above a respective one of said plurality of second raised source/drain regions.

15. The semiconductor device of claim 14, wherein said second semiconductor material is different from said first semiconductor material.

16. The semiconductor device of claim 14, wherein said second semiconductor material comprises one of a boron doped germanium material and a boron doped silicon-germanium material.

17. The semiconductor device of claim 14, further comprising:

an etch stop layer positioned above said first and second active regions, said etch stop layer comprising a first etch stop layer portion covering a first portion of said first active region and a second etch stop layer portion covering a second portion of said second active region; and an interlayer dielectric material positioned above said first and second active regions, said interlayer dielectric material covering said first and second etch stop layer portions, wherein at least a second one of said plurality of first raised source/drain regions is laterally confined between and in direct contact with said first etch stop layer portion and a sidewall spacer positioned adjacent to one of said plurality of first gate structures, and wherein at least a second one of said plurality of second raised source/drain regions is laterally confined between and in direct contact with said second etch stop layer portion and a sidewall spacer positioned adjacent to one of said plurality of second gate structures.

18. The semiconductor device of claim 17, wherein said second one of said plurality of first raised source/drain regions directly contacting said first etch stop layer portion further directly contacts a sidewall portion of said interlayer dielectric material covering said first etch stop layer portion, and wherein said second one of said plurality of first raised source/drain regions directly contacting said first etch stop layer portion further directly contacts a sidewall portion of said interlayer dielectric material covering said second etch stop layer portion.

19. The semiconductor device of claim 17, further comprising a liner layer positioned between each of said first and second etch stop layer portions and said upper surface of said respective first and second active regions, said liner layer comprising a same material as said sidewall spacers, wherein said second one of each of said plurality of first raised source/drain regions further contacts a sidewall surface of said liner layer positioned below a respective one of said first and second etch stop layer portions.

20. A semiconductor device, comprising:

a plurality of PMOS gate structures positioned above a PMOS active region defined in a semiconductor substrate;

a plurality of NMOS gate structures positioned above an NMOS active region defined in said semiconductor substrate;

a first interlayer dielectric material positioned above said PMOS and said NMOS active regions, said first interlayer dielectric material covering said pluralities of PMOS and NMOS gate structures;

an etch stop layer positioned between said first interlayer dielectric material and an upper surface of each of said PMOS and said NMOS active regions, said etch stop layer comprising a high-k dielectric material and having a first etch stop layer portion that covers a portion of said PMOS active region and a second etch stop layer portion that covers a portion of said NMOS active region;

a plurality of first raised source/drain regions comprising a first semiconductor material positioned on said upper surface of said PMOS active region, wherein said plurality of first raised source/drain regions are laterally confined by sidewalls of at least said first etch stop layer portion and first sidewall spacers positioned adjacent to sidewalls of each of said plurality of PMOS gate structures;

a layer of semiconductor material comprising one of boron doped germanium and boron doped silicon-germanium positioned above each of said plurality of first raised source/drain regions;

a plurality of first contact elements extending through a second interlayer dielectric material positioned above said first interlayer dielectric material, each of said plurality of first contact elements directly contacting an upper surface of said layer of semiconductor material positioned above a respective one of said plurality of first raised source/drain regions;

a plurality of second raised source/drain regions comprising a second semiconductor material positioned above said upper surface of said NMOS active region, wherein said plurality of second raised source/drain regions are laterally confined by sidewalls of at least said second etch stop layer portion and second sidewall spacers positioned adjacent to sidewalls of each of said plurality of NMOS gate structures; and a plurality of second contact elements extending through said second interlayer dielectric material, each of said plurality of second contact elements directly contacting an upper surface of a respective one of said plurality of second raised source/drain regions.

* * * * *